(12) United States Patent
Ohta et al.

(10) Patent No.: US 8,816,710 B2
(45) Date of Patent: Aug. 26, 2014

(54) INSPECTION CONTACT ELEMENT AND INSPECTING JIG

(75) Inventors: Norihiro Ohta, Kyoto (JP); Manabu Ohmayu, Kyoto (JP); Susumu Kasukabe, Kyoto (JP)

(73) Assignee: Nidec-Read Corporation, Kyoto (JP)

( * ) Notice: Subject to any disclaimer, the term of this patent is extended or adjusted under 35 U.S.C. 154(b) by 154 days.

(21) Appl. No.: 13/642,438

(22) PCT Filed: Apr. 15, 2011

(86) PCT No.: PCT/JP2011/059411
§ 371 (c)(1),
(2), (4) Date: Oct. 19, 2012

(87) PCT Pub. No.: WO2011/132613
PCT Pub. Date: Oct. 27, 2011

(65) Prior Publication Data
US 2013/0033278 A1 Feb. 7, 2013

(30) Foreign Application Priority Data
Apr. 19, 2010 (JP) ................................. 2010-095839

(51) Int. Cl.
*G01R 1/067* (2006.01)
*G01R 31/00* (2006.01)
*G01R 31/28* (2006.01)

(52) U.S. Cl.
CPC ........ *G01R 1/06722* (2013.01); *G01R 31/2808* (2013.01); *G01R 1/06738* (2013.01)
USPC ................. 324/750.25; 324/755.02

(58) Field of Classification Search
CPC ........... G01R 1/06722; G01R 1/06738; G01R 31/2808
See application file for complete search history.

(56) References Cited

U.S. PATENT DOCUMENTS

| | | | | |
|---|---|---|---|---|
| 6,097,198 A | * | 8/2000 | Oguro et al. | 324/756.07 |
| 6,844,748 B2 | * | 1/2005 | Sato et al. | 324/756.01 |
| 2013/0009658 A1 | * | 1/2013 | Nishikawa | 324/755.05 |
| 2014/0028343 A1 | * | 1/2014 | Numata et al. | 324/763.01 |

FOREIGN PATENT DOCUMENTS

| | | | | |
|---|---|---|---|---|
| JP | 02-114470 A | | 4/1990 | |
| JP | 2007-024664 A | | 2/2007 | |
| JP | 2008-256362 A | | 10/2008 | |
| JP | 2009-008579 A | | 1/2009 | |
| JP | 2010276510 A | * | 12/2010 | G01R 1/073 |
| JP | 2010281601 A | * | 12/2010 | G01R 1/073 |
| WO | WO01-09683 A1 | | 2/2001 | |

* cited by examiner

*Primary Examiner* — Jermele M Hollington
(74) *Attorney, Agent, or Firm* — Konomi Takeshita

(57) ABSTRACT

Provided is a micro contact element which is capable of coping with the miniaturization and greater complexity of substrates or boards, which is simplified due to a reduction in the number of components, and which creates sufficient contact pressure and stroke. Also provided is an inspection jig using this contact element. An inspection contact element having the contact pressure and amount of contraction required to carry out an inspection is formed by using notch parts respectively formed in two conductive cylindrical members having different outer and inner diameters so that the notch parts can function as elastic parts, and combining the two cylindrical members in such a way that the elastic parts are arranged in parallel or in series.

18 Claims, 10 Drawing Sheets

INSPECTION CONTACT ELEMENT AND INSPECTING JIG

CROSS REFERENCE TO RELATED APPLICATIONS

This application claims priority under 35 U.S.C. 119 and 35 U.S.C. 365 based upon Japanese Patent Application No. 2010-095839, filed on Apr. 19, 2010. The entire disclosure of the aforesaid application is incorporated herein by reference.

TECHNICAL FIELD

The present invention relates to an inspection jig electrically connecting an inspection point, which is preset on an inspection target section of an inspection target, and an inspection device carrying out this inspection, and an inspection contact element used in the inspection jig.

BACKGROUND ART

A inspection jig, to which inspection contact elements have been attached, supplies electric current or an electrical signal from an inspection device to a predetermined inspection position on an inspection target section of an object to be inspected via the inspection contact element, and detects the electrical signal from the inspection target section, thereby carrying out a detection test to detect the electrical characteristics of the inspection target section, and carrying out an operational test on the inspection target section.

The object to be inspected may be, for example, a variety of boards such as a printed circuit board, a flexible board, a ceramic multilayer printed circuit board, an electrode plate for a liquid crystal display or a plasma display, and a package board or film carrier for a semiconductor package, and semiconductor devices such as a semiconductor wafer, a semiconductor chip, and a chip size package (CSP).

In the present specification, the objects to be inspected are collectively called an "inspection target," and the inspection target section formed on the inspection target is called an "inspection section." Further, an inspection point is set for the inspection section in order to actually inspect electrical characteristics of the inspection section, and the contact element comes into contact with the inspection section under pressure, thereby conducting electricity with the inspection section.

When the inspection target is, for example, a board, and when it is a semiconductor circuit such as an integrated circuit (IC) or an electric/electronic part such as a resistor or a capacitor that is mounted on the board, a wiring or an electrode formed on the board becomes the inspection target section. In this case, to guarantee an electrical signal to be able to be accurately transmitted to the wiring of the inspection target section, electrical characteristics such as the resistance or the leak electric current between inspection points formed on a circuit board having the wiring of a printed circuit board, a liquid crystal panel, or a plasma display panel on which the electric/electronic part has not yet been mounted are measured. On the basis of the result of the measurement, it is determined whether or not the wiring is poor.

When the inspection target is large scale integration (LSI), an electronic circuit formed on the LSI becomes the inspection section, and surface pads of the electronic circuit become respective inspection points. In this case, to guarantee that the electronic circuit formed on the LSI has the desired electrical characteristics, the electrical characteristics between the inspection points are measured, and it is determined whether or not the electronic circuit is poor.

Conventionally, a plurality of wirings are formed on the circuit board that is one embodiment of the inspection target. These wirings are formed to supply power or send an electrical signal such that the electric/electronic part mounted on the circuit board can carry out its desired function. For this reason, poor wiring is known to be associated with poor operation of the circuit board.

To solve these problems, many inventions for the inspection device have been proposed so that the inspection device can determine the poor or good quality of a target section, such as the wiring formed on the inspection target, such as a circuit board.

This inspection device carries out the inspection using, for example, an inspection jig, which includes a plurality of inspection points preset on a wiring and a plurality of contact elements (probes) connected to the respective inspection points, in order to determine the poor or good quality of the wiring formed on the board acting as the inspection target.

This inspection jig is configured so that one end of the contact element comes into pressure-contact with the inspection point on the wiring (inspection section) and so that the other end of the contact element comes into pressure-contact with an electrode part electrically connected with the board inspection device. Thus, electric current or voltage for measuring electrical characteristics of the wiring is supplied from the board inspection device via the inspection jig, and an electrical signal detected from the wiring is transmitted to the board inspection device.

With the recent advancement of technologies, the wiring on the board is also adapted to be formed in a more minute and complex way along with miniaturization of semiconductor devices or miniaturization of boards. As the miniaturization and complexity increase of the wiring of the board are underway, the contact elements of the inspection jig are also requested to be made thinner or smaller, narrower in pitch between the contact elements, to have more pins, or to be simpler.

Here, for example, a micro-contact probe disclosed in Patent Document 1 suggests that a pair of plungers urged in a reverse direction by a coil spring are electrically connected via a densely wound spiral part, thereby decreasing inductance and resistance.

In Patent Document 1, as a second embodiment, a micro-contact probe formed by inserting a pair of plungers into the coil spring having a greater diameter than each of the pair of plungers is disclosed. By forming this contact probe, the plunger that comes into contact with an inspection point can come into contact under stronger pressure, and the plunger that comes into contact with a wiring plate can come into contact under weaker pressure. Further, due to a dual structure, the plungers can be attached in a small space.

However, since the micro-contact probe shown in Patent Document 1 is formed with the coil spring by winding, it is difficult to form a coil having about four times as small a diameter as the coil spring has, and it is very difficult to form a winding coil spring having an outer diameter of 100 μm or less and to assembly it as an inspection contact element. Even if so, it is excessively expensive to employ an inspection jig using 2000 to 4000 inspection contact elements due to a problem of manufacturing cost. As such, the micro-contact probe has a problem that it is not practical. Further, it is necessary to assembly a plurality of parts with high precision, which requires a lot of time.

Furthermore, if the contact element whose diameter is reduced to cope with a tendency to narrow a pitch is manufactured, sufficient contact pressure is not obtained. Thus, an oxide layer formed on a surface of the inspection point cannot be sufficiently destroyed, and contact resistance is not made stable when the inspection is carried out.

Patent Document 1: International Patent Application Publication No. WO2001/09683

DISCLOSURE

Technical Problem

The present invention provides a micro contact element which is capable of coping with the miniaturization and greater complexity of substrates or boards, which is simplified due to a reduction in the number of components, and which creates sufficient contact pressure and stroke, and an inspection jig using this contact element.

Technical Solution

The invention set forth in claim 1 provides an inspection jig that electrically connects an inspection target having a plurality of inspection points used as targets to be inspected and an inspection device inspecting electrical characteristics between the inspection points. The inspection jig includes an electrode body having a plurality of electrode parts electrically connected with the inspection device, inspection contact elements electrically connecting the electrode parts with the inspection points, and a holder having a first plate-like member guiding one ends of the inspection contact elements toward the electrode parts and a second plate-like member guiding the other ends of the inspection contact elements toward the inspection points, and holding the inspection contact elements. Each inspection contact element includes an outer tube whose one-end opening comes into contact with the second plate-like member, and an inner tube coaxially disposed inside the outer tube, and disposed to extend from the one-end opening of the outer tube. The outer tube includes an outer lower tube part having a one-side opening coming into contact with the second plate-like member, a first notch part spatially connected with the other-side opening of the outer lower tube part, formed in a tubular shape of the same diameter as the outer lower tube part, and having a spiral notch in a wall of the tubular shape in a longitudinal direction, and an outer upper tube part formed in a tubular shape of the same diameter as the first notch part and spatially connected with the first notch part. The inner tube includes an inner lower tube part having a one-side opening electrically connected with the inspection point, a second notch part spatially connected with an other-side opening of the inner lower tube part, formed in a tubular shape of the same diameter as the inner lower tube part, and having a spiral notch in a tubular wall in a longitudinal direction, and an inner upper tube part formed in a tubular shape with the same diameter as the second notch part and spatially connected with the second notch part. The outer tube and the inner tube have a fixed part fixing the outer lower tube part and the inner lower tube part. When the inner lower tube part of the inner tube comes into pressure-contact with the inspection point and inspection is carried out, the inner tube and the outer tube are sandwiched by the inspection point and the electrode body, and the first notch part and the second notch part are contracted.

The invention set forth in claim 2 is characterized in that, in addition to the configuration of the inspection jig according to claim 1, when the inner lower tube part of the inner tube does not come into contact with the inspection point, the inner tube and the outer tube are sandwiched by the inspection point and the electrode body, and the first notch part and the second notch part are contracted.

The invention set forth in claim 3 is characterized in that, in addition to the configuration of the inspection jig according to claim 1, when the inner lower tube part of the inner tube does not come into contact with the inspection point, the first notch part is kept at a natural length, and the second notch part is contracted as the inner tube is sandwiched by the second plate-like member and the electrode body.

The invention set forth in claim 4 is characterized in that, in addition to the configuration of the inspection jig according to claim 1, when the inner lower tube part of the inner tube does not come into contact with the inspection point, the first notch part is contracted as the outer tube is sandwiched by the second plate-like member and the electrode body, and the second notch part is kept at a natural length.

The invention set forth in claim 5 is characterized in that, in addition to the configuration of the inspection jig according to any one of claims 1 to 4, the inner tube includes a spiral notch formed in a periphery of the inner tube between the fixed part of the inner tube and the inspection point in a longitudinal direction.

The invention set forth in claim 6 is characterized in that, in addition to the configuration of the inspection jig according to any one of claims 1 to 5, a length by which the first notch part is contracted is adjusted by a distance from a surface of the electrode body to a surface of the second plate-like member and by a length of the outer tube.

The invention set forth in claim 7 provides an inspection jig that electrically connects an inspection target having a plurality of inspection points used as targets to be inspected and an inspection device inspecting electrical characteristics between the inspection points. The inspection jig includes an electrode body having a plurality of electrode parts electrically connected with the inspection device, inspection contact elements electrically connecting the electrode parts with the inspection points, and a holder holding the inspection contact elements. Each inspection contact element includes an outer tube whose front-end opening becomes an electrode end coming into contact with the electrode part, and a conductive inner tube which protrudes from a rear-end opening of the outer tube, which is electrically connected in the outer tube to be disposed coaxially with the outer tube, and whose front-end opening becomes an inspection end coming into contact with the inspection point under pressure. The outer tube includes an outer upper tube part having a front-side opening used as the electrode end, a first notch part which has the same diameter as the outer upper tube part, whose front-end opening is spatially connected with a rear-end opening of the outer upper tube part, and which has a spiral notch formed in a periphery in a longitudinal direction, and an outer lower tube part having the same diameter of the first notch part and spatially connected with a rear-end opening of the first notch part. The inner tube includes an inner lower tube part having a front-side opening becoming the inspection end, a second notch part which has the same diameter as the inner lower tube part, whose front-end opening is spatially connected with a rear-end opening of the inner lower tube part, and which has a spiral notch formed in a periphery in a longitudinal direction, and an inner upper tube part having the same diameter of the second notch part, spatially connected with a rear-end opening of the second notch part, and disposed in the outer tube. The outer tube and the inner tube have a fixed part that electrically connects and fixes the outer lower tube part and the inner upper tube part, and the holder includes a first plate-like member having a first guide hole guiding the electrode end of the outer tube toward the electrode part, and a second plate-like member disposed apart from the first plate-like member at a predetermined interval and having a second guide hole guiding the inspection end of the inner tube toward the inspection point.

The invention set forth in claim 8 is characterized in that, in addition to the configuration of the inspection jig according to claim 7, when the inspection end and the inspection point are in non-contact state, the outer tube is configured so that the front-end opening thereof comes into contact with the electrode part under pressure, and so that the rear-end opening thereof comes into contact with the second plate-like member under pressure.

The invention set forth in claim 9 is characterized in that, in addition to the configuration of the inspection jig according to claim 7 or 8, the rear-end opening of the inner tube is always housed in the outer upper tube part.

The invention set forth in claim 10 is characterized in that, in addition to the configuration of the inspection jig according to any one of claims 7 to 9, the front-end opening of the outer tube has an end face perpendicular to a longitudinal direction of the outer tube.

The invention set forth in claim 11 provides an inspection contact element that is electrically connected with one of a plurality of electrode parts installed on an electrode body of an inspection jig electrically connecting a plurality of inspection points of an inspection target which are used as targets to be inspected and an inspection device inspecting electrical characteristics between the inspection points. The inspection contact element includes an outer tube whose front-end opening becomes an electrode end that comes into contact with a surface of the electrode body, and a conductive inner tube which protrudes from a rear-end opening of the outer tube, which is electrically connected in the outer tube to be disposed coaxially with the outer tube, and whose front-end opening becomes an inspection end coming into contact with the inspection point under pressure. The outer tube includes an outer upper tube part having a front-side opening becoming the electrode end, a first notch part of a tubular shape which has the same diameter as the outer upper tube part, whose front-end opening is spatially connected with a rear-end opening of the outer upper tube part, and which has a spiral notch formed in a periphery in a longitudinal direction, and an outer lower tube part having the same diameter of the first notch part and spatially connected with a rear-end opening of the first notch part. The inner tube includes an inner lower tube part having a front-side opening becoming the inspection end, a second notch part of a tubular shape which has the same diameter as the inner lower tube part, whose front-end opening is spatially connected with a rear-end opening of the inner lower tube part, and which has a spiral notch formed in a periphery in a longitudinal direction, and an inner upper tube part having the same diameter as the second notch part, spatially connected with a rear-end opening of the second notch part, and coming into contact with the electrode part under pressure when the inner lower tube part comes into contact with the inspection point. The outer tube and the inner tube have a fixed part that electrically connects and fixes the outer lower tube part and the inner upper tube part.

The invention set forth in claim 12 is characterized in that, in addition to the configuration of the inspection jig according to claim 11, when one or both of the first notch part of the outer tube and the second notch part of the inner tube contract, the front-end opening of the outer tube and the rear-end opening of the inner tube are located on the same plane.

The invention set forth in claim 13 is characterized in that, in addition to the configuration of the inspection jig according to claims 11 to 12, the inner tube includes a spiral notch formed in a periphery of the inner tube between the fixed part of the inner tube and the inspection end in a longitudinal direction.

The invention set forth in claim 14 is characterized in that, in addition to the configuration of the inspection jig according to any one of claims 11 to 13, the front-end opening of the outer tube has an end face perpendicular to a longitudinal direction of the outer tube; and the rear-end opening of the inner tube has an end face perpendicular to a longitudinal direction of the inner tube.

The invention set forth in claim 15 provides an inspection contact element that is electrically connected with one of a plurality of electrode parts installed on an electrode body of an inspection jig electrically connecting a plurality of inspection points of an inspection target which are targets to be inspected and an inspection device inspecting electrical characteristics between the inspection points. The inspection contact element includes an outer tube whose front-end opening becomes an electrode end coming into contact with the electrode part, and a conductive inner tube which protrudes from a rear-end opening of the outer tube, which is electrically connected in the outer tube to be disposed coaxially with the outer tube, and whose front-end opening becomes an inspection end coming into contact with the inspection point under pressure. The outer tube includes an outer upper tube part having a front-side opening used as the electrode end, a first notch part of a tubular shape which has the same diameter as the outer upper tube part, whose front-end opening is spatially connected with a rear-end opening of the outer upper tube part, and which has a spiral notch formed in a periphery in a longitudinal direction, and an outer lower tube part having the same diameter of the first notch part and spatially connected with a rear-end opening of the first notch part. The inner tube includes an inner lower tube part having a front-side opening used as the inspection end, a second notch part of a tubular shape which has the same diameter as the inner lower tube part, whose front-end opening is spatially connected with a rear-end opening of the inner lower tube part, and which has a spiral notch formed in a periphery in a longitudinal direction, and an inner upper tube part having the same diameter as the second notch part, spatially connected with a rear-end opening of the second notch part, and disposed in the outer tube. The outer tube and the inner tube have a fixed part that electrically connects and fixes the outer lower tube part and the inner upper tube part.

The invention set forth in claim 16 is characterized in that, in addition to the configuration of the inspection jig according to claim 15, the rear-end opening of the inner tube is always housed in the outer upper tube part.

The invention set forth in claim 17 is characterized in that, in addition to the configuration of the inspection jig according to claims 15 to 16, the front-end opening of the outer tube has an end face perpendicular to a longitudinal direction of the outer tube.

The invention set forth in claim 18 is characterized in that, in addition to the configuration of the inspection jig according to any one of claims 11 to 17, the inspection contact element includes a conductive rod-like member disposed in the inner tube, and the rod-like member is fixed to the inner upper tube part or the inner lower tube part, and extends from the front-end opening of the inner tube.

Advantageous Effects

According to the invention set forth in claim 1, since the outer and inner tubes having respective spiral notch parts are disposed and fixed on the same axis, these outer and inner tubes function as one inspection contact element. The notch parts are formed in the outer and inner tubes in one body, and function as elastic parts that contract in a longitudinal direction. That is, the inspection contact element is configured to be formed of only three parts, i.e., the outer tube, the inner tube, and the fixed part. For this reason, the number of components can be further reduced compared to an inspection contact element using a coil spring, and the inspection contact element can be simply formed.

Further, since the notch parts functioning to contract as the elastic parts are configured to be arranged between the inspection point and the electrode part in parallel, sufficient contact pressure for carrying out the inspection can be generated. Accordingly, since the inspection contact element having sufficient contact pressure is used in the inspection jig, the inspection jig can be easily manufactured compared to a conventional inspection jig.

Furthermore, since the two notch parts are disposed in parallel to increase an applied load, a length that is contracted when pressed against the inspection point can be effectively secured. For this reason, even when there is a deviation in the height of the inspection point or in the length of the inspection contact element, the inspection contact element cannot be formed to be long and be brought into stable contact.

In addition, when the inspection contact element is put in contact with the inspection point and thus the inspection end comes into contact with the inspection point under pressure, both the front-end opening of the outer tube and the rear-end opening of the inner tube come into contact with the surface of the electrode body. As such, the inspection contact element can provide a stable connection and have stabilized contact against the inspection point.

According to the invention set forth in claim 2, when the inner tube does not come into contact with the inspection point, the inner tube and the outer tube are sandwiched by the second plate-like member and the electrode body, and the first notch part and the second notch part are contracted. As such, before and after the inspection is carried out, the electrode body always comes into contact with the inner tube and the outer tube. For this reason, the electrode body can come into contact with the inner tube and the outer tube without separation, and the durability of the electrode body can be improved.

According to the invention set forth in claim 3, when the inner tube does not come into contact with the inspection point, the first notch part is kept at a natural length, and the second notch part is contracted as the inner tube is sandwiched by the second plate-like member and the electrode body. As such, when no inspection is carried out, the inspection contact element can be held by using a contracting force of the second notch part only. When the inspection is carried out, the inspection point can be pressed by using contracting forces of the first and second notch parts. For this reason, before and after the inspection is carried out, the pressure generated by the inspection contact element can be adjusted.

According to the invention set forth in claim 4, when the inner tube does not come into contact with the inspection point, the second notch part is kept at a natural length, and the first notch part is contracted as the outer tube is sandwiched by the second plate-like member and the electrode body. As such, when no inspection is carried out, the inspection contact element can be held by using a contracting force of the first notch part only. When the inspection is carried out, the inspection point can be pressed by using contracting forces of the first and second notch parts. For this reason, before and after the inspection is carried out, the pressure generated by the inspection contact element can be adjusted.

According to the invention set forth in claim 5, the notch part is formed in the inner lower tube part of the inner tube of the inspection contact element, so that the inspection contact element can increase an amount (length) contracted when pressed against the inspection point. In this way, the inspection contact element has a longer amount of contraction. As such, even when there is a deviation in the height of the inspection point, or even when there is a deviation in the length of the inspection contact element, the inspection contact element can be sufficiently contracted and put in stable contact.

According to the invention set forth in claim 6, a length by which the first notch part is contracted is adjusted by a length of the outer tube according to a distance from a surface of the electrode body to a surface of the second plate-like member. As such, a contracting force of the first notch part can be appropriately adjusted with ease.

According to the invention set forth in claim 7, since the outer and inner tubes having respective spiral notch parts are disposed and fixed on the same axis, and are electrically connected and fixed, these outer and inner tubes function as one inspection contact element. The notch parts are formed in the outer and inner tubes in one body, and function as elastic parts that contract in a longitudinal direction. That is, the inspection contact element is configured to be formed of only three parts, i.e., the outer tube, the inner tube, and the fixed part. For this reason, the number of components can be further reduced compared to an inspection contact element using a coil spring, and the inspection contact element can be simply formed.

Further, since the inspection contact element is configured so that a diameter of the outer tube is greater than that of the inner tube. As such, even when the notch parts having similar lengths and shapes are formed, the outer tube has greater contact pressure compared to the inner tube. For this reason, by combining the outer tube and the inner tube, the contact pressure for carrying out the inspection can be sufficiently generated. Accordingly, since the inspection contact element having the sufficient contact pressure is used in the inspection jig, the inspection jig can be easily manufactured compared to a conventional inspection jig.

Furthermore, since the inspection contact element is configured so that the notch parts functioning as the elastic parts in the outer and inner tubes are disposed between the inspection point and the electrode part in series, a length that is contracted when pressed against the inspection point can be more sufficiently secured than when these notch parts are disposed in parallel. Even when there is a deviation in the length of the inspection contact element, no excessive dent is left from the inspection point.

According to the invention set forth in claim 8, sine the outer tube is configured so that the opposite-end openings thereof come into pressure-contact with the surface of the electrode body and the second plate-like member in non-contact state, the inspection contact element can be stably held in the inspection jig.

According to the invention set forth in claim 9, since the rear-end opening of the inner tube is not always put in contact with the electrode part, the rear-end opening of the inner tube does not perform an operation of being put in contact with and being separated from the electrode part when the inspection end is put in contact with the inspection target. As such, the durability of the inspection jig can be improved.

Further, since the inner upper tube part functions as the guide of the first notch part of the outer tube, the inspection contact element can be nearly linearly contracted.

According to the invention set forth in claim 10, since the front-end opening of the outer tube has a planar end face, it can be stably put in contact with the electrode part of the inspection jig.

According to the invention set forth in claim 11, since the outer and inner tubes having respective spiral notch parts are disposed and fixed on the same axis, and are electrically connected and fixed, these outer and inner tubes function as one inspection contact element. The notch parts are formed in the outer and inner tubes in one body, and function as elastic parts that contract in a longitudinal direction. That is, the inspection contact element is configured to be formed of only three parts, i.e., the outer tube, the inner tube, and the fixed part. For this reason, the number of components can be further reduced compared to an inspection contact element using a coil spring, and the inspection contact element can be simply formed.

Further, since the notch parts functioning to contract as the elastic parts are configured to be arranged between the inspection point and the electrode part in parallel or in series, the sufficient contact pressure for carrying out the inspection can be generated.

Further, since a length that is contracted when pressed against the inspection point can be sufficiently secured, the inspection contact element can be stably put in contact with the inspection contact even when there is a deviation in the height of the inspection point or in the length of the inspection contact element.

According to the invention set forth in claim 12, when the inspection contact element is held in the inspection jig, the front-end opening of the outer tube and the rear-end opening of the inner tube are put in contact with the surface of the electrode body. As such, an area of each tube put in contact with the surface of the electrode body increases, so that the inspection contact element can be more stably held in the inspection jig.

According to the invention set forth in claim 13, the notch part is also formed in the inner lower tube part of the inner tube of the inspection contact element, so that the inspection contact element can increase an amount (length) contracted when pressed against the inspection point. In this way, the inspection contact element has a longer amount of contraction. As such, even when there is a deviation in the height of the inspection point, or even when there is a deviation in the length of the inspection contact element, the inspection contact element can be sufficiently contracted and put in stable contact.

According to the invention set forth in claim 14, since the front-end opening of the outer tube and the other-end opening of the inner tube have a planar end face, they can be stably put in contact with the surface of the electrode body of the inspection jig. For this reason, when the inspection contact element is formed so that the end face of a coil spring comes into contact with the electrode part, a process of planarizing the end face of the coil spring, which is required to stably put the end face of the coil spring in contact with the electrode part, is not necessary. Thus, the inspection contact element can be more easily formed than that when using the coil spring.

According to the invention set forth in claim 15, since the outer and inner tubes having respective spiral notch parts are disposed and fixed on the same axis, and are electrically connected and fixed, these outer and inner tubes function as one inspection contact element. The notch parts are formed in the outer and inner tubes in one body, and function as elastic parts that contract in a longitudinal direction. That is, the inspection contact element is configured to be formed of only three parts, i.e., the outer tube, the inner tube, and the fixed part. For this reason, the number of components can be further reduced compared to an inspection contact element using a coil spring, and the inspection contact element can be simply formed.

Further, the inspection contact element is configured so that a diameter of the outer tube is greater than that of the inner tube. As such, even when the notch parts having similar lengths and shapes are formed, the outer tube has greater contact pressure compared to the inner tube. For this reason, by combining the outer tube and the inner tube, the contact pressure for carrying out the inspection can be sufficiently generated.

Furthermore, since the inspection contact element is configured so that the notch parts functioning as the elastic parts in the outer and inner tubes are disposed between the inspection point and the electrode part in series, a length that is contracted when pressed against the inspection point can be more sufficiently secured compared to when these notch parts are disposed in parallel. Even when there is a deviation in the length of the inspection contact element or in the length of the inspection contact element, no excessive dent is left from the inspection point.

According to the invention set forth in claim 16, since the rear-end opening of the inner tube is not always put in contact with the electrode part, the rear-end opening of the inner tube does not perform an operation of being put in contact with and being separated from the electrode part when the inspection end is put in contact with the inspection target. As such, the durability of the inspection jig can be improved.

Further, since the inner upper tube part functions as the guide of the first notch part of the outer tube, the inspection contact element can be nearly vertically contracted.

According to the invention set forth in claim 17, since the front-end opening of the outer tube has a planar end face, it can be stably put in contact with the electrode part of the inspection jig. For this reason, when the inspection contact element is formed so that the end face of a coil spring comes into contact with the electrode part, a process of planarizing the end face of the coil spring, which is required to stably put the end face of the coil spring in contact with the electrode part, is not necessary. Thus, the inspection contact element can be more easily formed than that when using the coil spring.

According to the invention set forth in claim 18, the conductive rod-like member is disposed in the inner tube, and a front end thereof extends from the front-end opening of the inner tube. For this reason, the rod-like member functions as a part of the inspection contact element, and the extending front end thereof can come into reliable contact with the inspection point. As such, the inspection point and the inspection contact element can be electrically connected in a reliable way.

DESCRIPTION OF DRAWINGS

FIG. 3 is an exploded cross-sectional view of the first contact element, wherein

FIG. 10 is a schematic cross-sectional view of the inspection jig using a fourth contact element, wherein

FIG. 11 is a schematic cross-sectional view of the inspection jig using a fifth contact element, wherein

MODE FOR INVENTION

Reference will now be made to a best mode for carrying out the present invention.

Figure 1:
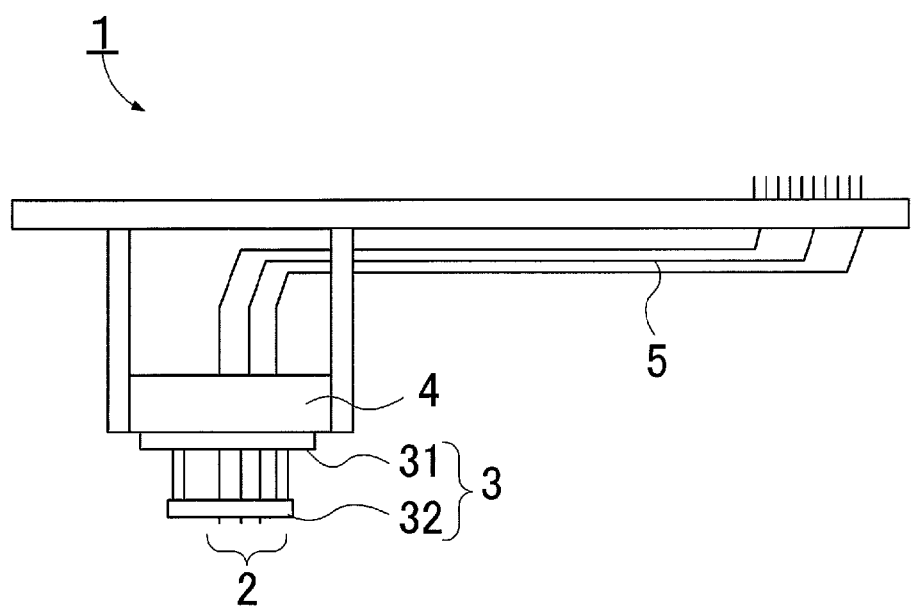
FIG. 1 is a schematic configuration view showing a first embodiment of an inspection jig according to the present invention.

FIG. 1 is a schematic configuration view showing a first embodiment of an inspection jig according to the present invention. An inspection jig 1 according to the present invention includes a plurality of contact elements 2, a holder 3 holding these contact elements 2 in a multi-needle shape, an electrode body 4 that supports the holder 3 and has electrode parts 41 (see FIG. 5), each of which is in contact with each contact element 2 in a state of conduction, and conducting wire parts 5 that are electrically connected to and extend from the electrode parts 41.

In FIG. 1, as the plurality of contact elements 2, three contact elements are shown, and three conducting wire parts 5 corresponding to the three contact elements are shown. However, these are not limited to three, and they are decided based on an inspection point set on an inspection target.

The present invention is mainly characterized in that one inspection contact element having the contact pressure and amount of contraction required to carry out the inspection is formed by using notch parts respectively formed in two conductive cylindrical members having different outer and inner diameters so that they can function as elastic parts respectively, and combining the two cylindrical members in such a way that the elastic parts are arranged in parallel or in series.

This configuration provides a contact element which is capable of adapting to the miniaturization and complexity of boards, which is simplified due to the reduction in the number of components, and which makes sufficient contact pressure and contracts by a sufficient amount, and an inspection jig using this contact element.

Figure 2:
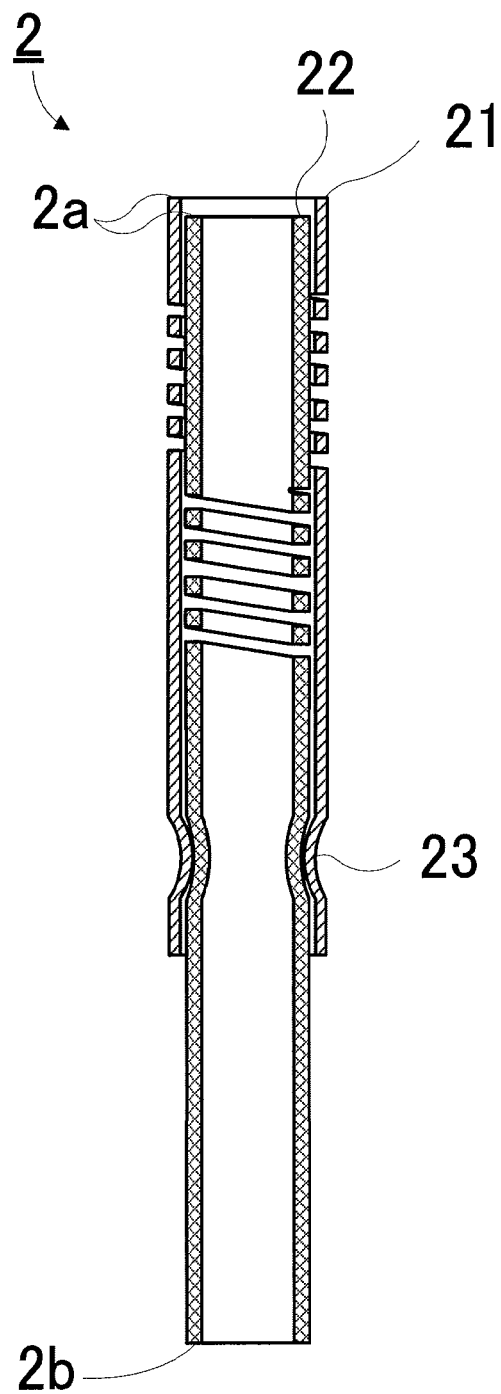
FIG. 2 is a schematic cross-sectional view of a contact element (first contact element) of the first embodiment of the present invention.
Figures 3A, 3B:
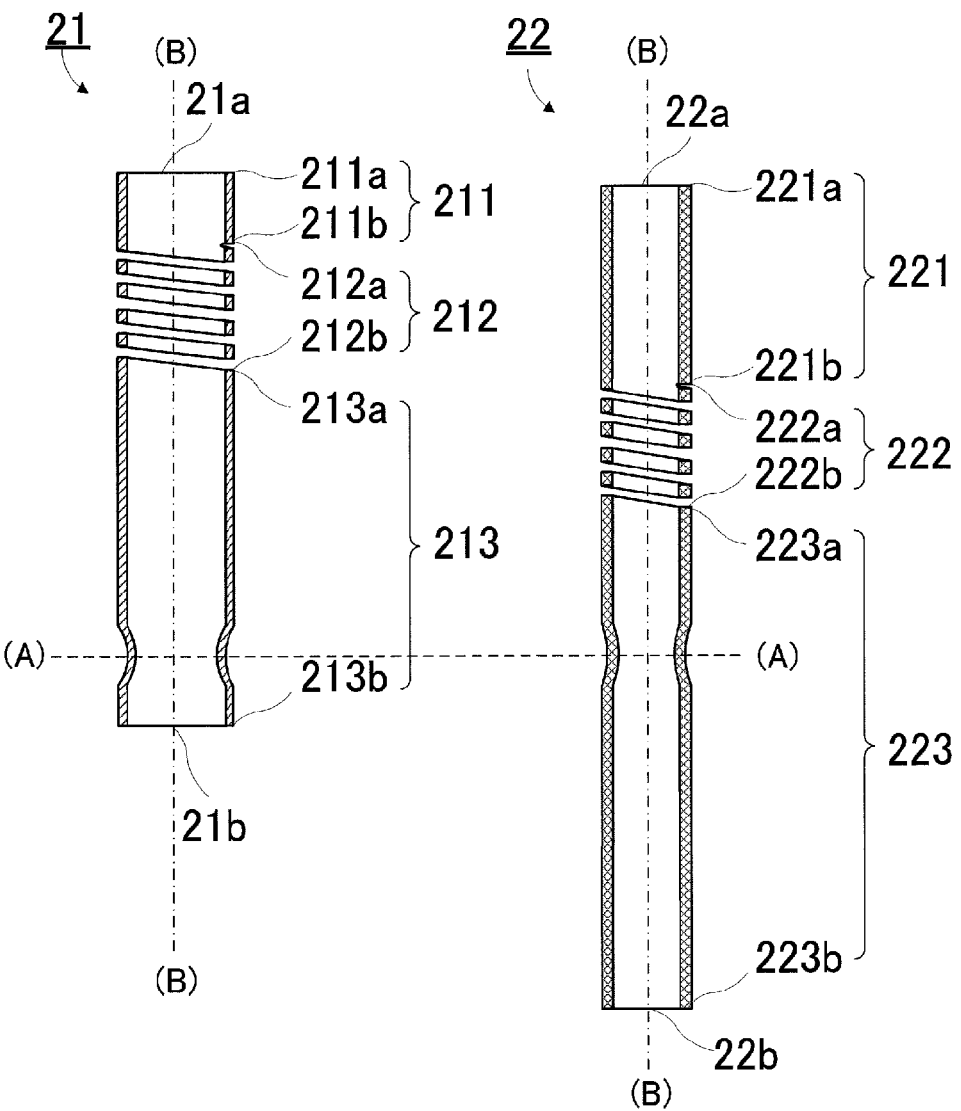
FIG. 3(a) shows an outer tube and FIG. 3(b) shows an inner tube. Further, a position at which the outer tube and the inner tube are fixed is indicated by dotted line A-A, and the central axis of the first contact element is indicated by a dot and dash line B-B.

An inspection contact element 2 (hereinafter referred to as "first contact element 2") of a first embodiment according to the present invention will be described. FIG. 2 is a schematic cross-sectional view of a first contact element 2 of the present invention. FIG. 3 is an exploded cross-sectional view of the first contact element 2, wherein FIG. 3(a) shows an outer tube 21 and FIG. 3(b) shows an inner tube 22.

The first contact element 2 includes an electrode end 2a connected to the electrode part 41 of the electrode body 4, and an inspection end 2b coming into contact with the inspection point 81 of an inspection target 8 under pressure, and electrically connects the electrode part 41 and the inspection point 81.

As shown in FIG. 2, the first contact element 2 includes outer and inner tubes 21 and 22 that differ in outer and inner diameters, and a fixed part 23. The inner tube 22 is disposed inside the outer tube 21 on the same axis as the outer tube 21, and is fixed by the fixed part 23 so as to be in a state of conduction with the outer tube 21.

As shown in FIG. 3(a), the outer tube 21 is a cylindrical member having a slightly greater inner diameter than an outer diameter of the inner tube 22. The outer tube 21 is formed in a conductive hollow cylindrical (tubular) shape that has a predetermined length and has uniform outer and inner diameters over its entire length. Further, the outer tube 21 has openings 21a and 21b at opposite ends thereof. The one-end opening 21a comes into contact with the electrode part 41 to be described below, thereby allowing the outer tube 21 to be electrically connected with the electrode part 41. The one-end opening 21a is designed to correspond to the electrode end 2a of the first contact element 2 (see FIG. 2).

Meanwhile, the one-end opening 21a and the other-end opening 21b of the outer tube 21, and the one-end opening 22a and the other-end opening 22b of the inner tube 22 correspond to the front-end opening and the rear-end opening of an outer tube, and the rear-end opening and the front-end opening of an inner tube in the section "Advantageous Effects," respectively.

Further, the one-end opening and the other-end opening of each of an outer upper tube part 211, a first notch part 212, and an outer lower tube part 213 correspond to the front-end opening and the rear-end opening of each of an outer upper tube part, a first notch part, and an outer lower tube part in the section "Advantageous Effects," respectively.

Furthermore, the one-end opening and the other-end opening of each of an inner upper tube part 221, a second notch part 222, and an inner lower tube part 223 correspond to the rear-end opening and front-end opening of each of an inner upper tube part, a second notch part, and an inner lower tube part in the section "Advantageous Effects," respectively.

The outer tube 21 is disposed in such a way that the inner tube 22 to be described below protrudes from the other-end opening 21b. Further, when the first contact element 2 is mounted on the holder 3, the other-end opening 21b may come into contact with a second plate-like member 32 of the holder 3, and lock the first contact element 2 on the holder 3.

The outer tube 21 is formed of one conductive cylindrical member, and includes an outer upper tube part 211, a first notch part 212, and an outer lower tube part 213 (see FIG. 3(a)). These parts are disposed from the one-end opening 21a toward the other-end opening 21b in the order of the outer upper tube part 211, the first notch part 212, and the outer lower tube part 213.

As described above, the outer tube 21 can be formed of one conductive cylindrical member. However, the outer tube 21 may be formed, for instance, at an outer diameter of 40 to 250 µm, an inner diameter of 30 to 240 µm, and a thickness of 5 to 50 µm.

The outer tube 21 is formed of a conductive material. However, this material is not particularly limited as long as it has conductivity. Examples of the material of the outer tube 21 are nickel, nickel alloy, or a palladium alloy.

The outer tube of the present invention may be manufactured under the conditions as described above. However, a tube manufactured, in addition to the aforementioned conditions, particularly, at an outer diameter less than 100 µm and an inner diameter less than 90 µm may be used as the outer tube 21. Thereby, the first contact element 2 may be appropriately used as the inspection contact element provided to the inspection jig used to inspect wirings or electronic circuits.

A longitudinal length of the outer tube 21 may be formed to be shorter than the inner tube 22 to be described below. This is because, although this will be described in detail below, when the outer tube 21 and the inner tube 22 are combined, the assembly thereof can be made easy.

Figure 4:
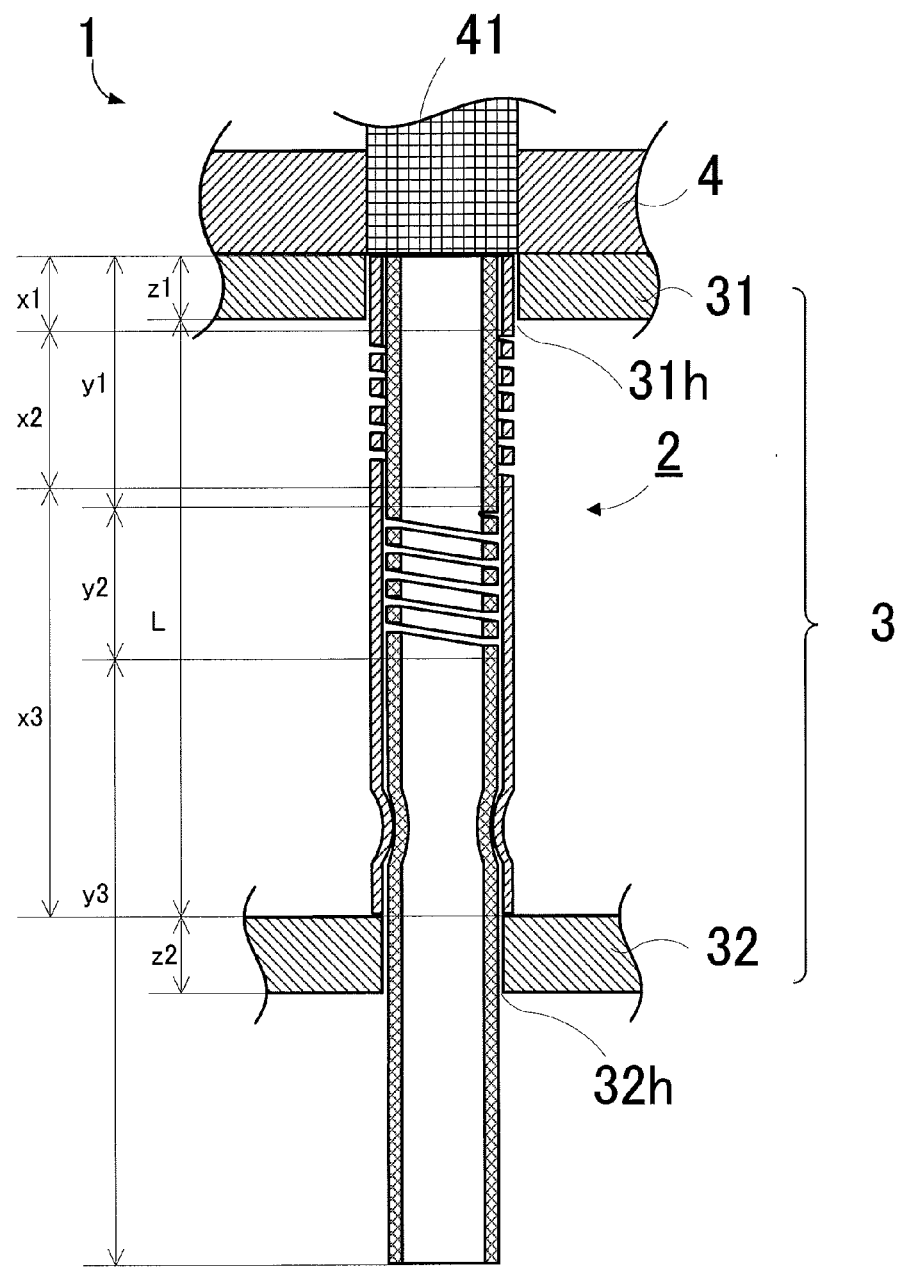
FIG. 4 is a schematic cross-sectional view of the inspection jig using the first contact element. For convenience of description, symbols showing a length of each part of the first contact element and a length of each part of a holder are included. The length of an outer upper tube part 211 of an outer tube 21 is indicated by x1, the length of a first notch part 212 by x2, the length of an outer lower tube part 213 by x3, the length of an inner upper tube part 221 of an inner tube 22 by y1, the length of a second notch part 222 by y2, the length of an inner lower tube part 223 by y3, the thickness of a first plate-like member 31 of the holder 3 by z1, the thickness of a second plate-like member 32 by z2, and the interval between opposite faces of the first plate-like member 31 and the second plate-like member 32 by L.
Figure 4:
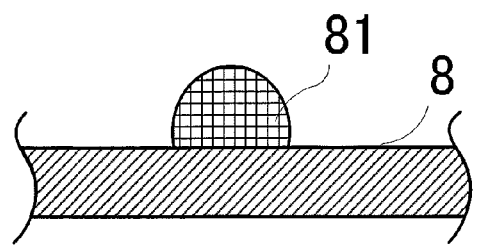

FIG. 4 is a schematic cross-sectional view showing a state in which the first contact element 2 is held to the holder 3, and the holder 3 is attached to the inspection jig 1.

Further, a length x2 of the first notch part 212 and a length y2 of the second notch part 222, both of which are shown in FIG. 4, are lengths that are more contracted than natural lengths thereof, and are different from lengths in a no-load state, because they are attached to the inspection jig 1.

The outer upper tube part 211 is a cylindrical member having the one-end opening 211a and the other-end opening 211b (see FIG. 3(a)). The one-end opening 211a corresponds to the one-end opening 21a of the outer tube 21, and comes into contact with the electrode part 41. Since the one-end opening 211a is formed so as to have an end face perpendicular to a longitudinal direction of the outer upper tube part 211, when the one-end opening 211a comes into contact with the electrode part 41, the end face thereof comes into contact with the electrode part 41, and thus the outer tube 21 is allowed to come into stable contact with the electrode part 41.

The other-end opening 211b of the outer upper tube part 211 is spatially connected with the one-end opening 212a of the first notch part 212 to be described below.

The outer upper tube part 211 passes through and is supported in a first guide hole 31h (which will be described below) formed in a first plate-like member 31 when held to the holder 3, and is guided to a predetermined electrode part 41. A longitudinal length x1 of the outer upper tube part 211 is not particularly limited. For example, as shown in FIG. 4, when the first contact element 2 is mounted on the holder 3, the longitudinal length x1 of the outer upper tube part 211 may be formed so as to be longer than a thickness z1 of the first plate-like member 31 (a depth of the first guide hole 31h), and in such a way that a value obtained by adding it to the length x2 of the first notch part 212 to be described below is shorter than a length y1 of the inner upper tube part 221 to be described below. As this condition, for example, the condition of "x1>z1 and x1+x2<y1" may be set.

Thereby, when the first notch part 212 to be described below is contracted, the first notch part 212 can be prevented from coming into contact with an opening end edge of the first guide hole 31h formed in the first plate-like member 31. Further, the first notch part 212 and the second notch part 222 can be prevented from coming into contact with each other.

The first notch part 212 is formed by making a spiral notch along a wall of the cylindrical member forming the outer tube 21 in a longitudinal direction of the cylindrical member. By forming the spiral notch in the outer tube 21 in this way, the first notch part 212 functions as an elastic part that contracts in the longitudinal direction of the outer tube 21. The first notch part 212 includes the one-end opening 212a and the other-end opening 212b.

The one-end opening 212a is spatially connected with the other-end opening 211b of the outer upper tube part 211, and the other-end opening 212b is spatially connected with the one-end opening 213a of the outer lower tube part 213. For this reason, the first notch part 212 is disposed between the outer upper tube part 211 and the outer lower tube part 213.

An elastic expansion/contraction characteristic of the first notch part 212 is allowed to be properly adjusted by adjustment of a width, pitch or length of the notch part, adjustment of a thickness of the cylindrical member, a kind of material of the cylindrical member, or by applying a variety of treatments (thermal treatment and chemical treatment) to the cylindrical member, and is appropriately adjusted by a user. Although one notch part is formed in the first notch part 212 shown in FIG. 3, two notch parts may be symmetrically formed apart from each other at a predetermined interval, or three or more notch parts may be formed.

The length x2 of the first notch part 212 may be formed by adjusting a length so as to have a desired contraction length or contact pressure, and simultaneously be set so as to be disposed at a position at which, as described above, when the first contact element 2 is mounted on the holder 3, the first notch part 212 is not in contact with the first plate-like member 31 or the second notch part 222. In FIG. 4, the first notch part 212 may be formed and disposed so as to be shorter than a length between a inspection point side surface of the first plate-like member 31 and the one-end opening of the second notch part 222 (a difference between the length y1 of the inner upper tube part 221 and the thickness z1 of the first plate-like member). As this condition, for example, the condition of "x2<y1−z1" may be set.

The outer lower tube part 213 includes one-end opening 213a and the other-end opening 213b. The one-end opening 213a is spatially connected with the other-end opening 212b of the first notch part 212, and the other-end opening 213b corresponds to the other-end opening 21b of the outer tube 21. Since the other-end opening 213b of the outer lower tube part 213 has an end face perpendicular to an longitudinal direction of the outer lower tube part 213, when the first contact element 2 is mounted on the holder 3, the end face of the other-end opening 213b of the outer lower tube part 213 is allowed to make stable contact with the second plate-like member 32 in plane.

Further, the fixed part 23 to be described below is formed on the outer lower tube part 213. Due to the fixed part 23, the outer tube 21 and the inner tube 22 are electrically connected and fixed.

The longitudinal length x3 of the outer lower tube part 213 is formed at a length at which the other-end opening 21b of the outer tube 21 can come into contact with the second plate-like member 32.

The outer upper tube part 211, the first notch part 212, and the outer lower tube part 213 of the outer tube 21 may be formed in such a way that the outer upper tube part 211 and the outer lower tube part 213 are equal in length so as to have a symmetrical shape with respect to the first notch part 212. By forming the outer tube 21 in this way, the outer tube 21 has the symmetrical shape, and provides no difference in an upward/downward direction, so that the first contact element 2 is easily assembled.

The inner tube 22 is a member that forms a part of the first contact element 2 and comes into contact with the inspection point 81 (see FIG. 3(b)). The inner tube 22 has an outer diameter that is slightly smaller than an inner diameter of the outer tube 21. The inner tube 22 is formed in a conductive hollow cylindrical (tubular) shape that has a predetermined length and has the same diameter over its entire length. Further, the inner tube 22 has openings at opposite ends thereof. The other-end opening 22b comes into contact with the inspection point 81 in a state of conduction, and makes it possible to form an electrical connection between the inner tube 22 and the inspection point 81. Further, the other-end opening 22b of the inner tube 22 corresponds to the inspection end 2b of the first contact element 2.

Further, the one-end opening 22a of the inner tube 22 comes into contact with the electrode part 41 in a state of conduction, and makes it possible to form an electrical connection between the inner tube 22 and the electrode part 41. Further, the one-end opening 22a of the inner tube 22 corresponds to the electrode end 2a of the first contact element 2 (see FIG. 2).

The inner tube 22 is configured so that a part of the other-end opening 22b side thereof protrudes from the other-end opening 21b of the outer tube 21 and is disposed inside the outer tube 21 on the same axis.

The inner tube 22 is formed of one conductive cylindrical member, and includes an inner upper tube part 221, a second notch part 222, and an inner lower tube part 223 (see FIG. 3(b)). These parts are disposed from the one-end opening 22a toward the other-end opening 22b in the order of the inner upper tube part 221, the second notch part 222, and the inner lower tube part 223.

As described above, the inner tube 22 can be formed of one conductive cylindrical member. However, the inner tube 22 may be formed, for instance, to have an outer diameter of 30 to 250 µm, an inner diameter of 20 to 240 µm, and a thickness of 5 to 50 µm.

The inner tube of the present invention may be manufactured under the conditions described above. However, a tube manufactured among the aforementioned conditions, particularly, at an outer diameter less than 80 µm and an inner diameter less than 70 µm may be used as the inner tube 22. Thereby, the first contact element 2 may be appropriately used as the inspection contact element provided to the inspection jig used to inspect wirings or electronic circuits.

The inner tube 22 is formed of a conductive material. However, this material is not particularly limited as long as it has conductivity. Examples of the material of the inner tube 22 are nickel, nickel alloy, or a palladium alloy.

A longitudinal length of the inner tube 22 may be formed to be longer than the length of the outer tube 21. This is because, when the first contact element 2 is mounted on the holder 3, an end face of the other-end opening 21b of the outer tube 21 comes into contact with the second plate-like member 32, and the inner tube 21 electrically connects the electrode part 41 and the inspection point 81, and thus the other-end opening 22b of the inner tube 22 must protrude from a second guide hole 32h, which is formed in the second plate-like member 32 of the holder 3 to be described below, toward the inspection point 81. Further, when the outer tube 21 and the inner tube 22 are combined to form the first contact element 2, the first contact element 2 can be easily assembled by arranging the one-end opening 21a of the outer tube 21 and the one-end opening 22a of the inner tube 22 and fixing the tubes at the fixed part.

The inner upper tube part 221 is a cylindrical member having the one-end opening 221a and the other-end opening 221b. The one-end opening 221a corresponds to the one-end opening 22a of the inner tube 22, and comes into contact with the electrode part 41. Since the one-end opening 221a is formed so as to have an end face perpendicular to a longitudinal direction of the inner upper tube part 221, when the one-end opening 221a comes into contact with the electrode part 41 to be described below, the end face thereof comes into contact with the electrode part 41, so that the inner tube 22 can make stable contact with the electrode part 41.

The other-end opening 221b of the inner upper tube part 221 is spatially connected with the one-end opening 222a of the second notch part 222 to be described below.

Since the inner upper tube part 221 is coaxially disposed inside the outer tube 22 passing through and supported in the first guide hole 31h formed in the first plate-like member 31 when held to the holder 3, the inner upper tube part 221 is guided to a predetermined electrode part 41, like the outer upper tube part 211. A longitudinal length y1 of the inner upper tube part 221 is not particularly limited. However, as shown in FIG. 4, when the first contact element 2 is mounted on the holder 3, the length y1 may be formed to be longer than a value obtained by adding the length x2 of the first notch part 212 to the length x1 of the outer upper tube part 211 of the outer tube 21. As this condition, for example, the condition of "y1>x1+x2" may be set.

Thereby, when the first notch part 212 and the second notch part 222 to be described below carry out the motion of contraction, the first notch part 212 of the outer tube 21 and the second notch part 222 of the inner tube 22 can be prevented from coming into contact with each other.

The second notch part 222 is formed by providing a spiral notch along a wall of the cylindrical member forming the inner tube 22 in a longitudinal direction of the cylindrical member. By forming the spiral notch in the inner tube 22 in this way, the second notch part 222 functions as an elastic part contracted in the longitudinal direction of the inner tube 22. The second notch part 222 includes the one-end opening 222a and the other-end opening 222b.

The one-end opening 222a is spatially connected with the other-end opening 221b of the inner upper tube part 221, and the other-end opening 222b is spatially connected with the one-end opening 223a of the inner lower tube part 223. For this reason, the second notch part 222 is disposed between the inner upper tube part 221 and the inner lower tube part.

An elastic expansion/contraction characteristic of the second notch part 222 is allowed to be properly adjusted by adjustment of a width, pitch or length of the notch part, adjustment of a thickness of the cylindrical member, the kind of material used to make the cylindrical member, or by applying a variety of treatments (thermal treatment and chemical treatment) to the cylindrical member, and is appropriately adjusted by a user. Although one notch part is formed in the second notch part 222 shown in FIG. 3(b), two notch parts may be symmetrically formed apart from each other at a predetermined interval, or three or more notch parts may be formed.

A length y2 of the second notch part 222 may be formed by adjusting a length so as to have a desired contraction length or contact pressure, and simultaneously be set in such a way that, when the first contact element 2 is mounted on the holder 3 as described above, the second notch part 222 does not come into contact with the second plate-like member 32 and the first notch part 212. For example, in FIG. 4, the second notch part 222 is formed and disposed to be shorter than the length x3 of the outer lower tube part 213. As this condition, for example, the condition of "y2<x3" may be set.

The inner lower tube part 223 is a cylindrical member having the one-end opening 223a and the other-end opening 223b. The one-end opening 223a of the inner lower tube part 223 is spatially connected with the other-end opening 222b of the second notch part 222, and the other-end opening 223b of the inner lower tube part 223 corresponds to the other-end opening 22b of the inner tube 22. Since the other-end opening 223b of the inner lower tube part 223 has an end face perpendicular to a longitudinal direction of the inner lower tube part 223, when the first contact element 2 is mounted on the holder 3, the end face of the other-end opening 223b of the inner lower tube part 223 is allowed to reliably come into contact with the inspection point 81 under pressure even when the inspection point 81 is formed in a plane shape, in a spherical shape, or in a convex shape.

Further, the fixed part 23 to be described below is formed on the inner lower tube part 223. Due to this fixed part 23, the outer tube 21 and the inner tube 22 are electrically connected and fixed.

Similarly to the outer upper tube part 211, a longitudinal length y3 of the inner lower tube part 223 may be set in such a way that the second notch part 222 does not come into contact with the second plate-like member 32 and the first notch part 212. Further, even when the other-end opening 223b of the inner lower tube part 223 comes into contact with the inspection point 81 and thus the second notch part 222 of the inner tube 22 is contracted, the length y3 is formed so as to have a length at which the other-end opening 22b of the inner tube 22 can protrude from the second plate-like member 32 (see FIG. 5).

The inner upper tube part 221, the second notch part 222, and the inner lower tube part 223 of the inner tube 22 may be formed in such a way that the inner upper tube part 221 and the inner lower tube part 223 are equal in length so as to have a symmetrical shape with respect to the second notch part 222. By forming the inner tube 22 in this way, the inner tube 22 is imparted with a symmetrical shape, and there is no difference between upward and downward directions, so that the first contact element 2 is easily assembled.

As shown in FIG. 2, the inner tube 22 is disposed in such a way that the other-end opening 22b protrudes from the other-end opening 21b of the outer tube 21. Further, the one-end opening 22a of the inner tube 22 is disposed so as not to protrude from the one-end opening 21a of the outer tube 21. In a case in which the one-end opening 22a of the inner tube 22 is disposed so as to protrude from or be the same plane as the one-end opening 21a of the outer tube 21, when the first contact element 2 is mounted on the holder 3, the first notch part 212 and the second notch part 222 are contracted, and thereby the one-end opening 21a of the outer tube 21 and the one-end opening 22a of the inner tube 22 are allowed to simultaneously come into contact with the electrode part 41 under pressure.

Further, the one-end opening 22a of the inner tube 22 is also allowed to be disposed so as to protrude from the one-end opening 21a of the outer tube 21. Even in this case, when the first contact element 2 is mounted on the holder 3, the second notch part 222 is contracted first, and the first notch part 212 is contracted as needed. Thereby, the one-end opening 21a of the outer tube 21 and the one-end opening 22a of the inner tube 22 simultaneously come into contact with the electrode part 41 under pressure. Further, an amount (length) at which the one-end opening 22a of the inner tube 22 protrudes from the one-end opening 21a of the outer tube 21 is not particularly limited but, when the first contact element 2 is mounted on the holder 3, it may be formed at the same length as an amount at which first notch part 212 of the outer tube 21 is contacted. In this case, when the first contact element 2 is mounted on the holder 3, the force by which only the second notch part 222 of the inner tube 22 is contracted to cause contact under pressure is generated. As such, there can be a reduction in the great amount of force applied to the holder 3. Further, the first notch part 212 of the outer tube 21 is contracted for the first time in the event of an inspection, so that an amount of pressing force can be properly adjusted before and after the inspection is carried out as well as when the inspection is carried out.

The disposition of the one-end opening 22a of the inner tube 22 and the one-end opening 21a of the outer tube 21 is adjusted as described above, and thereby the one-end opening 21a of the outer tube 21 and the one-end opening 22a of the inner tube 22 are put in contact with the electrode part 41 at all times. For this reason, whenever the inspection end 2b comes into contact with the inspection point 81, the one-end opening 21a of the outer tube 21 and the one-end opening 22a of the inner tube 22 do not carry out a contacting/separating operation on the electrode part 41. As such, an improvement in durability of the inspection jig 1 can be facilitated.

The fixed part 23 is formed on the outer lower tube part 213 of the outer tube 21 and the inner lower tube part 223 of the inner tube 22, thereby fixing the outer tube 21 and the inner tube 22. When the fixture is carried out by, for instance, caulking as this fixing method, as shown in FIG. 2, pressing is carried out from the side of the outer tube 21 (outer lower tube part 213) toward the side of the inner tube 22, and thereby the outer tube 21 and the inner tube 22 are fixed. The fixed part 23 is formed in a concave shape that is curved inwardly at the outer lower tube part 213 (see FIG. 3(a)). After the inner tube 22 is disposed in the outer tube 21, the fixed part 23 is formed to fix the outer tube 21 and the inner tube 22, but it may be previously formed on the outer tube 21. Further, the fixed part 23 of the concave shape is an example showing how, to fix the outer tube 21 and the inner tube 22, it is formed by fixing the tubes by pressing (caulking) them from an outer side (outer tube 21) toward an inner side (inner tube 22).

The method of fixing the outer tube 21 and the inner tube 22 using the fixed part 23 is not limited to this caulking method. Thus, another fixing method such as laser welding, arc welding, or an adhesive may be used. As the method used to fix the outer tube 21 and the inner tube 22, when a fixing method in which the outer tube 21 and the inner tube 22 are electrically connected is used, welding is not required. However, when a fixing method in which the outer tube 21 and the inner tube 22 are not electrically connected is used, the outer tube 21 and the inner tube 22 may also be configured to be electrically connected by, for instance, solder or a conducting wire.

The first contact element 2 can be appropriately carried out on the conditions as described above. Further, conditions as described below may also be set.

The first notch part 212 of the outer tube 21 is not disposed inside the first guide hole 31h, but it is disposed on an outer circumference of the inner upper tube part 221 of the inner tube 22. Further, the second notch part 222 of the inner tube 22 is not disposed inside the second guide hole 32h, but it is disposed inside the outer lower tube part 213 of the outer tube 21.

These conditions are set to form each member, and thereby an operation of each notch part is made more reliable. Thus, the first contact element 2 can be suitably manufactured.

FIG. 4 is a cross-sectional view showing the state in which the first contact element 2 is attached to the holder 3. The inspection jig 1 has the holder 3 for holding the first contact element 2. The holder 3 includes the first plate-like member 31 and the second plate-like member 32.

The first plate-like member 31 has the first guide hole 31h for guiding the electrode end 2a of the first contact element 2 toward the electrode part 41. The first guide hole 31h is formed as a through-hole formed to have the same diameter over the entire thickness direction of the first plate-like member 31. An outer diameter of the through-hole is formed so as to have a diameter that is slightly greater than that of the outer tube 21. The first guide hole 31h guides the electrode end 2a of the first contact element 2 toward the electrode part 41. In greater detail, the first guide hole 31h guides the one-end opening 21a of the outer tube 21 toward the electrode part 41. In this case, the one-end opening 22a of the inner tube 22 is also disposed to be coaxial with the outer tube 21, and is thus guided toward the electrode part 41.

A thickness z1 of the first plate-like member 31 is formed to be shorter than the length x1 of the outer upper tube part 211. This is because, as described above, in the state in which the first contact element 2 is held to the holder 4 and is attached to the electrode part 41, the outer upper tube part 211 passes through and is supported in the first guide hole 31h, and when the first notch part 212 does a contraction operation, it is preferable that the first notch part 212 does not come into contact with the first plate-like member 31.

The second plate-like member 32 is disposed so that it is separated from the first plate-like member 31 by a predetermined interval, and has the second guide hole 32h for guiding the inspection end 2b of the first contact element 2 toward the inspection point 81. The second guide hole 32h is a through-hole formed at the same diameter throughout a thickness direction of the second plate-like member 32, and is formed at an outer diameter that is smaller than the outer diameter of the outer tube 21 and is slightly greater than the outer diameter of the inner tube 22.

By forming the second guide hole 32h in this way, when the first contact element 2 is inserted into the holder 3, the other-end opening 21b of the outer tube 21 of the first contact element 2 is locked on an edge of the second guide hole 32h on the surface of the second plate-like member 32. This is because there exists a difference between the diameter of the second guide hole 32h and the outer diameter of the outer tube 22. In this case, the other-end opening 22b of the inner tube 22 is disposed to protrude from the second guide hole 32h of the second plate-like member 32.

The second guide hole 32h guides the inspection end 2b of the first contact element 2 toward the inspection point 81. In greater detail, the second guide hole 32h is configured to guide the other-end opening 22b of the inner tube 22 of the first contact element 2 toward the inspection point 81.

A thickness z2 of the second plate-like member 32 is formed to be shorter than the length y3 of the inner lower tube part 223.

This is because, in the state in which the first contact element 2 is held to the holder 4 and is attached to the electrode part 41, the inner lower tube part 223 can pass through and be supported in the second guide hole 32h.

The second plate-like member 32 is configured to be disposed apart from the first plate-like member 31 by the predetermined interval L. The predetermined interval L is set in such a way that a distance between a surface of the electrode part 41 and an electrode-side surface of the second plate-like member 32 (a value obtained by adding the thickness z1 of the first plate-like member 31 to the predetermined interval L) is slightly shorter than the longitudinal length of the outer tube 21 in a no-load state.

Thereby, when the first contact element 2 is mounted on the holder 3, the first notch part 212 of the outer tube 21 is contracted in a biased state, and the outer tube 21 is mounted in a state in which it presses the electrode part 41 and the second plate-like member 32. For this reason, the outer tube 21 is allowed to be mounted on the holder 3 in the state in which it presses the electrode part 41, and to stably hold the first contact element 2 to the holder 3.

In this case, since the one-end opening 22a of the inner tube 22 also comes into contact with the electrode parts 41 under pressure, the reliable connection of the inner tube 22 and the electrode part 41 is made possible.

In FIG. 4, the second guide hole 32h is shown as the through-hole having the same diameter. However, the second guide hole 32h may be a through-hole formed by two holes (upper and lower holes, not shown) having two different outer diameters disposed on the same axis. In this case, the upper hole is disposed on the side of the electrode part of the second plate-like member 32 and has a diameter that is slightly greater than the outer diameter of the outer tube 21, whereas the lower hole is disposed on the side of the inspection point of the second plate-like member 32 and has a diameter that is smaller than the outer diameter of the outer tube 21 and is slightly greater than the outer diameter of the inner tube 22.

By forming the upper and lower holes in this way, when the first contact element 2 is inserted from the first guide hole 31h and is mounted on the holder 3, the outer tube 21 can be locked by a difference between the outer diameter of the other-end opening 21b of the outer tube 21 and the diameter of the lower hole, and thus only the inner tube 22 can be disposed so as to protrude from the second guide hole 32h.

Further, in FIG. 4, the first plate-like member 31 and the second plate-like member 32 are disposed at a predetermined interval. However, a third plate-like member (not shown) may be installed between the first plate-like member 31 and the second plate-like member 32. The third plate-like member may be configured so that one or two or more plate-like members are stacked and it is disposed in a space caused by the interval between them. In this case, the third plate-like member may also be formed, for instance, by stacking a plurality of plate-like members identical to the first plate-like member 31. Further, a through-hole formed in the third plate-like member is not particularly limited to its cross-sectional shape as long as it has a size through which the outer tube 21 of the first contact element 2 passes.

The electrode body 4 is formed with the electrode parts 41 corresponding to the respective first contact elements 2. Each electrode part 41 comes into pressure-contact with the one-end opening 21a of the outer tube 21 and the one-end opening 22a of the inner tube 22 in a state of conduction.

In FIG. 4, the electrode part 41 is formed so as to come into pressure-contact with the one-end opening 21a of the outer tube 21 and the one-end opening 22a of the inner tube 22.

However, this is an example of the first embodiment, and a shape of the electrode part 41 is not limited to this shape.

For example, when the inspection point 81 is disposed at a pitch that is much narrower than that shown in FIG. 4, the electrode part 41 may be formed to be smaller than the outer diameter of the outer tube 21, and only the one-end opening 22*a* of the inner tube 22 may be disposed so as to come into contact with the electrode part 41. In this case, the one-end opening 21*a* of the outer tube 21 comes into contact with a surface of the electrode body 4 around the electrode part 41.

The foregoing description has been made of the configuration of the inspection jig 1 of the first embodiment of the present invention.

The outer and inner tubes 21 and 22 of the first contact element 2 are formed by combining the cylindrical members having the notch part. However, as one method of forming the cylindrical member, the following manufacturing method may be employed.

(1) First, a core wire (not shown) forming a hollow part of the cylindrical member is prepared. For this core wire, a core wire (e.g., stainless steel (SUS) having a diameter of 30 μm) having the desired conductivity and thickness is used. The thickness of the wire determines the inner diameter of the cylindrical member.

(2) Next, a photoresist film is applied to the core wire (stainless wire), thereby covering a circumferential surface of the core wire. A desired portion of the photoresist is subjected to exposure, development, and heating, thereby forming a spiral mask. In this case, the spiral mask may be formed, for instance, by rotating the core wire around its central axis and exposing the core wire using a laser. To form the cylindrical member of the present invention, a mask for forming the notch part is adapted to be formed at a predetermined position.

(3) Subsequently, the core wire is plated with nickel. Here, since the core wire has conductivity, a place where the photoresist mask is not formed is plated with nickel.

(4) Then, the photoresist mask is removed, and the core wire is pulled out. Thereby, the cylindrical member of a desired length is formed. It goes without saying that, after the core wire is completely pulled out, the tube may be cut.

When the holder 3 is attached to the inspection jig 1, first, the first contact element 2 is inserted into the holder 3. When inserted into the holder 3, the first contact element 2 is inserted by passing the electrode end 2*a* of the first contact element 2 into the first guide hole 31*h*, and then passing the inspection end 2*b* of the first contact element 2 into the second guide hole 32*h*. The first contact element 2 inserted into the holder 3 is locked on the holder 3 by the other-end opening 21*b* of the outer tube 21. In this case, the opposite-end openings (the electrode end 2*a* and the inspection end 2*b*) of the first contact element 2 are disposed so as to protrude outwardly from the first guide hole 31*h* and the second guide hole 32*h*, respectively.

When the first contact element 2 is inserted into the holder 3, the first plate-like member 31 is brought into contact with the electrode body 4 in such a way that the one-end opening 21*a* of the outer tube 21 and the one-end opening 22*a* of the inner tube 22 come into contact with the electrode part 41 under pressure. In this case, since the outer tube 21 and the inner tube 22 come into contact with the electrode part under pressure, the first notch part 212 and the second notch part 222 are contracted in a biased state. For this reason, regardless of whether or not the other-end opening 22*b* (inspection end side) of the inner tube comes into contact with the inspection point 81, the one-end opening 21*a* of the outer tube 21 and the one-end opening 22*a* of the inner tube 22 are always in contact with the electrode part 41. Thereby, the inspection jig 1 having the first contact element 2 is finished.

Next, using the inspection jig 1 to carry out an inspection will be described.

Figure 5:
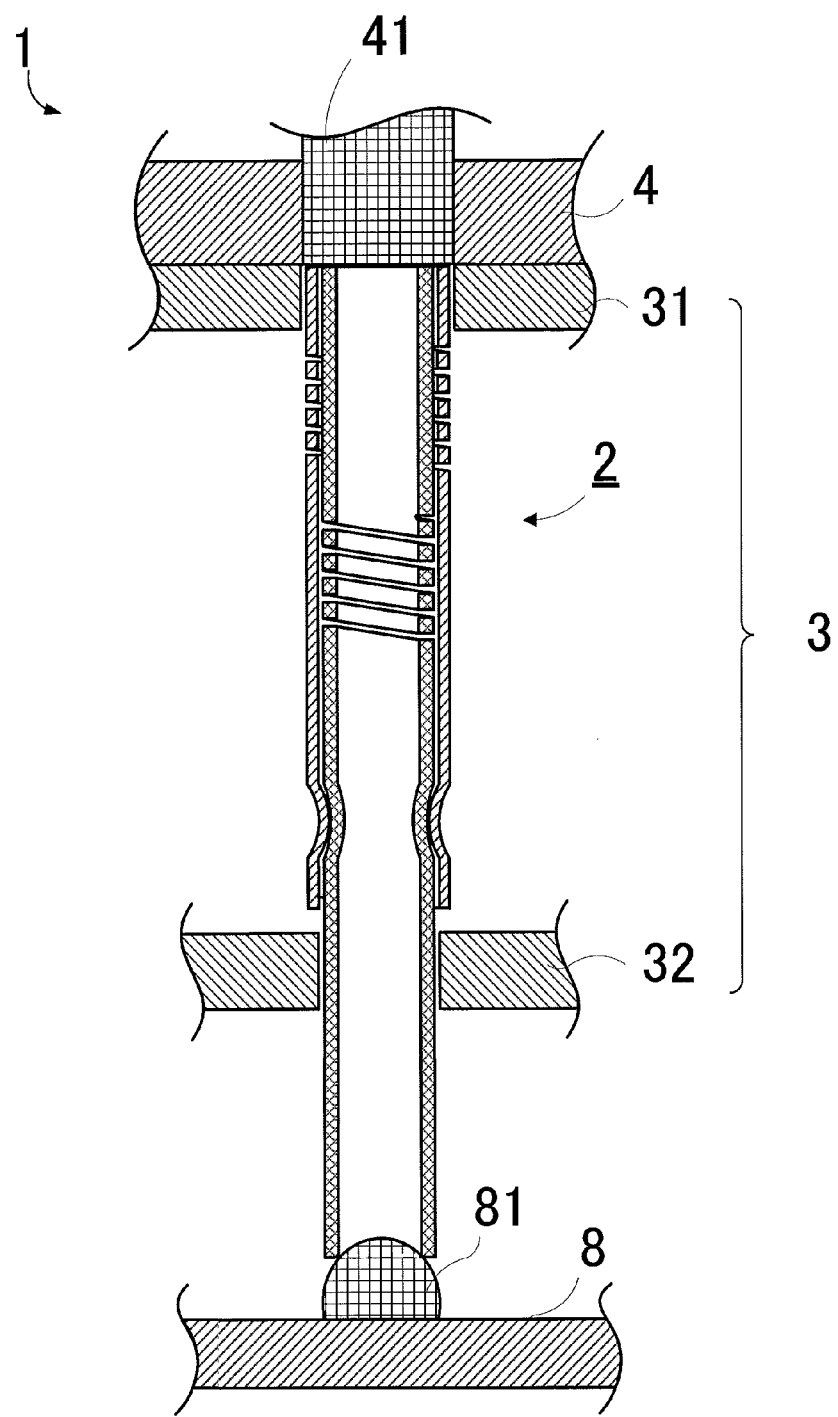
FIG. 5 is a schematic cross-sectional view showing a state of the inspection jig using the first contact element when inspection is carried out.

FIG. 5 is a schematic cross-sectional view showing a state of the inspection jig using the first contact element when carrying out an inspection.

When the inspection is being carried out, the inspection jig 1 is mounted on an inspection device (not shown), and the conducting wires 5 are electrically connected to controlling means of the inspection device.

The inspection device includes moving means that can move a mounting table on which an object 8 to be inspected is placed in the x-, y-, and z-axial directions, and carries out the inspection by moving the mounting table in the x-, y-, and z-axial directions so as to bring the inspection ends 2*b* of predetermined first contact elements 2 into pressure-contact with a plurality of inspection points 81 of the object 8 to be inspected.

In the inspection device, when the mounting table is positioned so as to allow the desired first contact elements 2 to come into contact with the predetermined inspection points 81, the inspection device, each of the first contact elements 2 moves so as to be allowed to come into contact with each inspection point 81 in a state of conduction.

Here, when the desired inspection end 2*b* comes into contact with the predetermined inspection point 81, first, the other-end opening 22*b* of the inner tube 22 which becomes the inspection end 2*b* comes into contact under pressure. As such, the second notch part 222 of the inner tube 22 is contracted. In this case, since the outer tube 21 is fixed by the inner tube 22 and the fixed part 23, the first notch part 212 of the outer tube 21 is also contracted at the same time. Thus, due to the contraction of these notch parts 212 and 222, the inspection point 81 and the electrode part 41 are electrically connected via the first contact element 2 by contact pressure of a value that is found by adding up the restorative forces of the first and second notch parts 212 and 222.

The foregoing description has been made of the inspection jig of the first embodiment.

Next, an inspection jig 10 of a second embodiment of the present invention will be described.

Figure 7:
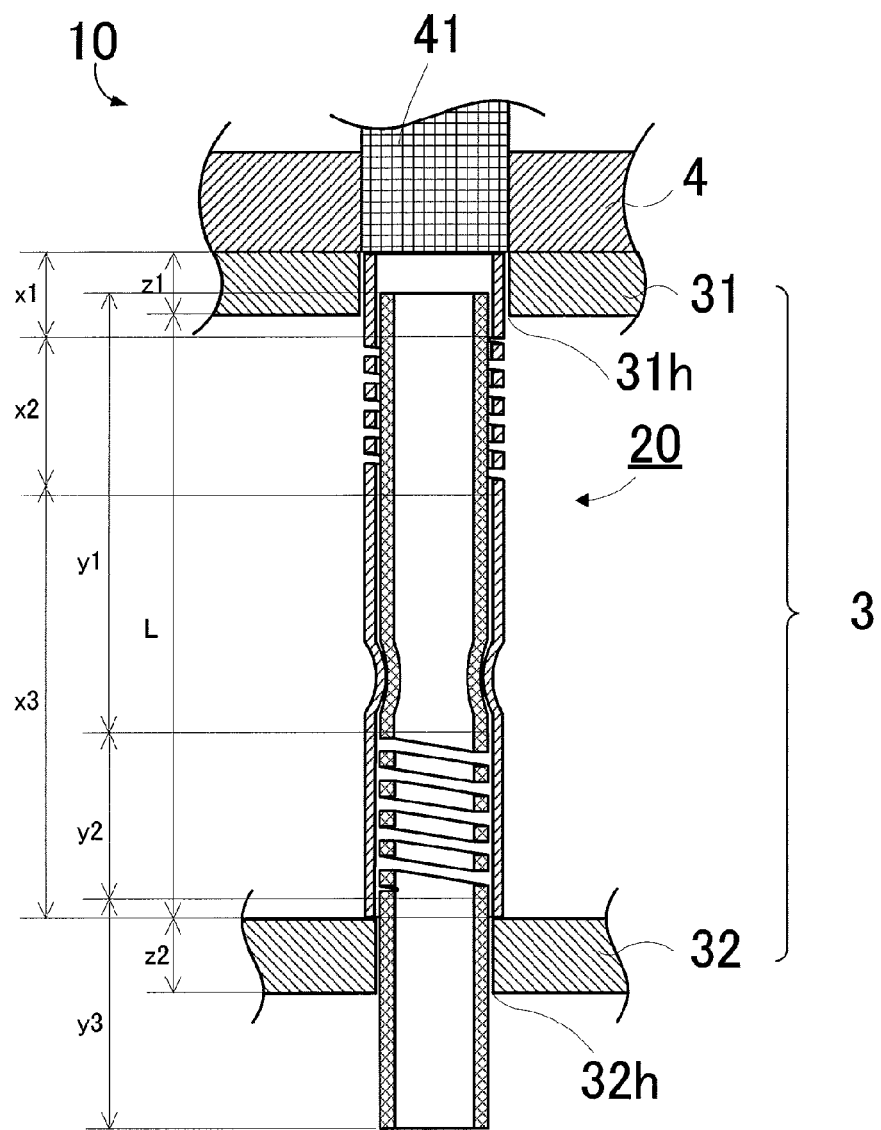
FIG. 7 is a schematic cross-sectional view of the inspection jig using the second contact element. For convenience of description, symbols showing a length of each part of the second contact element and a length of each part of a holder are included. The length of an outer upper tube part 211 of an outer tube 21 is indicated by x1, the length of a first notch part 212 by x2, the length of an outer lower tube part 213 by x3, the length of an inner upper tube part 221 of an inner tube 22 by y1, the length of a second notch part 222 by y2, the length of an inner lower tube part 223 by y3, the thickness of a first plate-like member 31 of the holder 3 by z1, the thickness of a second plate-like member 32 by z2, and the interval between opposite faces of the first plate-like member 31 and the second plate-like member 32 by L.
Figure 7:
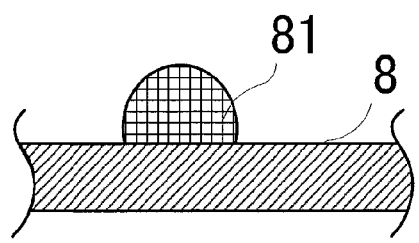

A main difference between the inspection jig 10 shown in FIG. 7 and the inspection jig 1 of the first embodiment lies in the configuration of the inspection contact element held to the holder. In the following description, different configuration portions of the inspection contact element will be mainly described, and similar portions will be described as little as possible.

An inspection contact element 20 (hereinafter referred to as "second contact element 20") used for the inspection jig 10 of the second embodiment will be described. Since the second contact element 20 has a configuration similar to that of the first contact element 2, the same configuration will be described using the same symbol.

Figure 6:
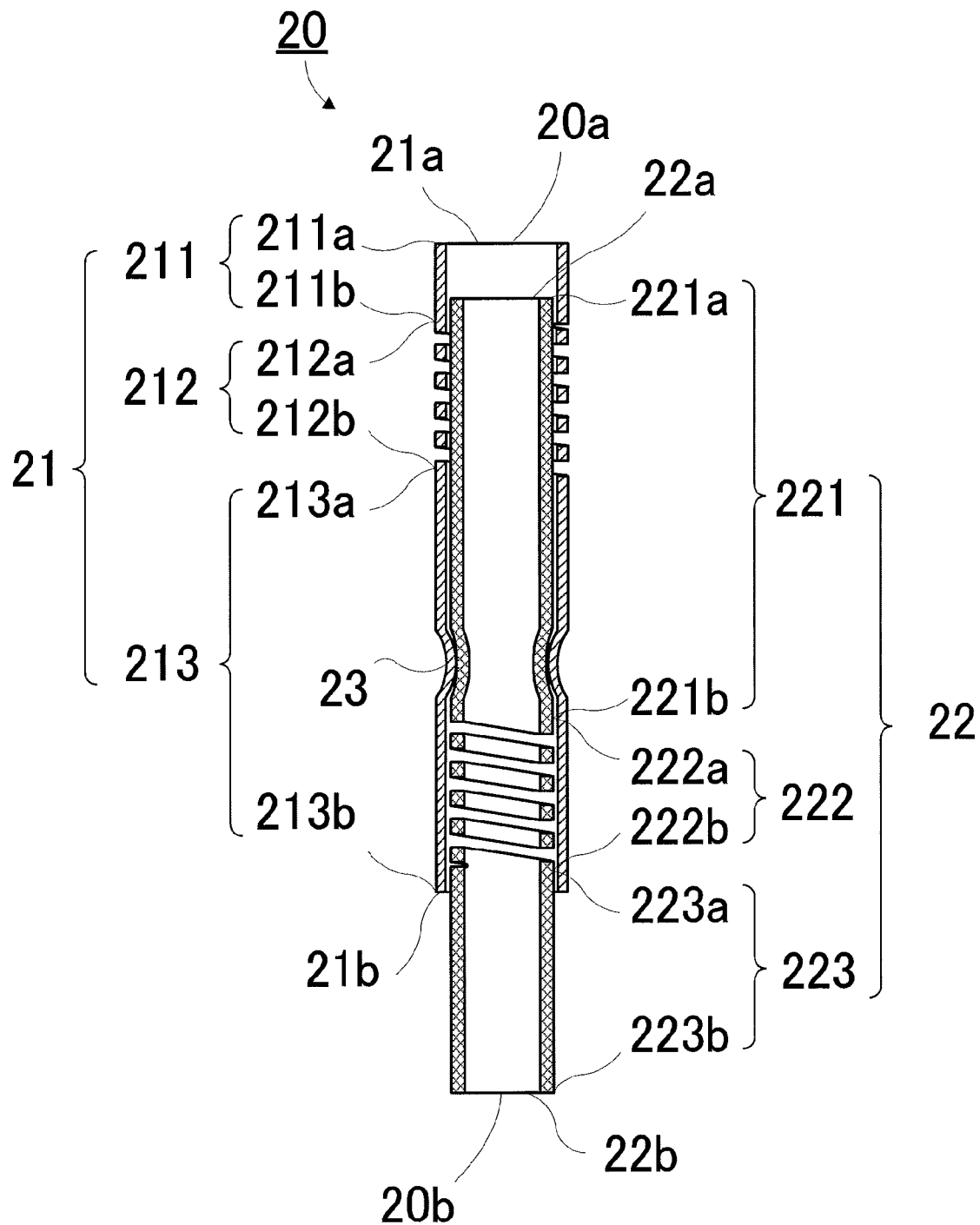
FIG. 6 is a schematic cross-sectional view of a contact element (second contact element) of a second embodiment of the present invention.

FIG. 6 is a schematic cross-sectional view of the second contact element 20. FIG. 7 shows a state in which the second contact element 20 is held to a holder 3 and the holder 3 is attached to the inspection jig 10. A length x2 of a first notch part 212 shown in FIG. 7 is a length that is more contracted than its natural length. On the other hand, a length y2 of a second notch part 222 is the length in a no-load state.

A main difference between the second contact element 20 and the first contact element 2 is the fixed part 23, more particularly, the position at which the fixed part 23 is formed. The fixed part 23 of the first contact element 2 fixedly connects the outer lower tube part 213 of the outer tube 21 and the inner lower tube part 223 of the inner tube 22, whereas the fixed part 23 of the second contact element 20 fixedly connects an outer lower tube part 213 of an outer tube 21 and an inner upper tube part 221 of an inner tube 22.

The second contact element 20 electrically connects an electrode part 41 of an electrode body 4 of the inspection jig 10 and an inspection point 81 of an object 8 to be inspected. In greater detail, the second contact element 20 has openings in opposite ends thereof. An electrode end 20a of the second contact element 20 comes into pressure-contact with the electrode part 41, and an inspection end 20b of the second contact element 20 comes into pressure-contact with the inspection point 81. Thereby, the electrode part 41 and the inspection point 81 are electrically connected.

As shown in FIG. 6, the second contact element 20 includes the outer tube 21, the inner tube 22, and the fixed part 23.

The outer tube 21 of the second contact element 20 has approximately the same configuration as the basic configuration of the outer tube 21 of the first contact element 2, but a length of each part thereof may be adjusted on the condition that is different from the length of each part of the outer tube 21 of the first contact element 2. This occurs because there is a difference in the position of the fixed part 23 between the second contact element 20 and the first contact element 2, as will be described in more detail below.

The length x1 of the outer upper tube part 211 is not particularly limited. However, as shown in FIG. 7, the length x1 may be formed so as to be longer than the thickness z1 of a first plate-like member 31 (the depth of a first guide hole 31h).

Thereby, when the second contact element 20 is held to the holder 3, and when the first notch part 212 is contracted, the first notch part 212 can be prevented from coming into contact with an opening edge of the first guide hole 31h of the first plate-like member 31.

The length x2 of the first notch part 212 may be formed by adjusting a length so as to have a desired contraction length or contact pressure, and simultaneously be set so as to be disposed at a position at which, as described above, when the second contact element 20 is held to the holder 3, the first notch part 212 does not come into contact with the first plate-like member 31. In FIG. 7, the first notch part 212 is allowed to be disposed in such a way that a value obtained by adding its length to a length x3 of the outer lower tube part 213 to be described below is formed to be shorter than an interval L between the first plate-like member 31 and the second plate-like member 32. As this condition, for example, the condition of "x2+x3<L" may be set.

The length x2 of the first notch part 212 may be formed so as to be shorter than the length y1 of the inner upper tube part 221 of the inner tube 22. By forming the length based on this condition, when the second contact element 20 is mounted on the holder 3 and is thus contracted, the first notch part 212 and the one-end opening 22a of the inner tube 22 can be prevented from coming into contact with each other.

As this detailed condition, for example, the condition of "x2<y1" may be set. However, the length y1 of the inner upper tube part 221 may be configured so that, even when the first notch part 212 of the outer tube 21 is contracted when the inspection end 20a of the second contact element 20 comes into contact with the inspection point 81 under pressure, the one-end opening 221a of the inner upper tube part 221 is adjusted and disposed so as not to come into contact with the first notch part 212.

The longitudinal length x3 of the outer lower tube part 213 is not particularly limited. However, as described above, the length x3 may be formed so as to have a length at which the other-end opening 213b of the outer tube 21 can come into contact with the second plate-like member 32.

The inner tube 22 of the second contact element 20 has approximately the same configuration as the inner tube 22 of the first contact element 2, but a length of each part thereof may be adjusted based on the condition that it is different from the length of each part of the inner tube 22 of the first contact element 2. This results from a difference in the position of the fixed part 23 between the second contact element 20 and the first contact element 2, as will be described in detail below.

When the second contact element 20 is held to the holder 3 to be described below, a longitudinal length of the inner tube 22 is at least formed to be longer than a value obtained by adding up the length x2 of the first notch part 212 of the outer tube 21, the length x3 of the outer lower tube part 213 of the outer tube 21, and the thickness z2 of the second plate-like member 32 of the holder 3. Thereby, when the second contact element 20 is held to the holder 3, the other-end opening 22b of the inner tube 22 is allowed to come into contact with the inspection point 81.

The inner upper tube part 221 is formed with the fixed part 23 to be described below. Due to the fixed part 23, the outer tube 21 and the inner tube 22 are electrically connected and fixed.

The length y1 of the inner upper tube part 221 is formed in such a way that a value obtained by adding it to the length y2 of the second notch part 222 to be described below is longer than a value obtained by adding the length x2 of the first notch part 212 of the outer tube 21 to the length x3 of the outer lower tube part 213 of the outer tube 21. As this condition, for example, the condition of "x2+x3<y1+y2" may be set. However, even when the first notch part 212 of the outer tube 21 is contracted when the inspection end 20b of the second contact element 20 comes into contact with the inspection point 81 under pressure, the length y1 of the inner upper tube part 221 may be adjusted in such a way that the one-end opening 221a of the inner upper tube part 221 does not come contact with the first notch part 212, and the one-end opening 221a of the inner upper tube part 221 may be adjusted so as not to come into contact with the electrode part 41 when the second contact element 20 is mounted on the holder 3 and is contracted.

This is intended to prevent the one-end opening 221a from coming into contact with the first notch part 212 and from repeating a contacting/separating operation with respect to the electrode parts 41 by disposing the one-end opening 221a so as to be housed inside the outer upper tube part 211. Further, this is because, since the inner upper tube part functions as a guide when the first notch part of the outer tube is contracted, the second contact element 20 can be vertically contracted.

The length y1 of the inner upper tube part 221 is not limited to the length shown above. For example, the length y1 of the inner upper tube part 221 may be formed in such a way that the value obtained by adding it to the length y2 of the second notch part 222 to be described below is shorter than the length x3 of the outer lower tube part 213 of the outer tube 21.

The length y2 of the second notch part 222 may be adjusted so as to have a desired contraction length or contact pressure, and simultaneously be set in such a way that, when the second contact element 20 is mounted on the holder 3, the second notch part 222 does not come into contact with the second plate-like member 32 as described above. In FIG. 7, the second notch part 222 is disposed in such a way that the length y2 of the second notch part 222 is formed to be shorter than the length x3 of the outer lower tube part 213. As this condition, for example, the condition of "x3>y2" may be set.

The length y3 of the inner lower tube part 223 may be set in such a way that the second notch part 222 does not come into contact with the edge of the second guide hole 32h formed in the second plate-like member 32. Further, even when the other-end opening 223b of the inner lower tube part 223 comes into contact with the inspection point 81 and the second notch part 222 of the inner tube 22 and the first notch part 212 of the outer tube 21 are contracted, the length y3 is formed so as to have a length at which the other-end opening 223b of the inner lower tube part 223 can protrude from a inspection point-side surface of the second plate-like member 32 (see FIG. 7).

The fixed part 23 is formed on the outer lower tube part 213 of the outer tube 21 and the inner upper tube part 221 of the inner tube 22, thereby fixing the outer tube 21 and the inner tube 22. A shape and fixing method of the fixed part 23 are similar to those of the fixed part 23 of the first embodiment, and so the description thereof will be omitted.

The second contact element 20 can be appropriately designed based on the conditions described above. However, the conditions described below may also be used.

The first notch part 212 of the outer tube 21 is not disposed inside the first guide hole 31h, but is housed inside the inner upper tube part 221 of the inner tube 22. Further, the outer upper tube part 211 of the outer tube 21 houses the inner upper tube part 221 of the inner tube 22, and the inner upper tube part 221 is disposed in such a way that, even when the inner tube 22 is contracted, the one-end opening 22a does not come into contact with the electrode part 41. Further, the second notch part 222 of the inner tube 22 is not disposed inside the second guide hole 32h, but it is disposed inside the outer lower tube part 213 of the outer tube 21.

These conditions are set to form each member, and thereby the notch parts are prevented from coming into contact with each other. Thus, the second contact element 20 can be suitably implemented.

The foregoing description has been made of the inspection contact element 20 (second contact element 20) of the second embodiment.

Hereinafter, when using the second contact element 20, the inspection jig 10 will be described.

The holder 3 is a member holding the second contact element 20, and the configuration and shape thereof are similar to those of the holder 3 of the first embodiment.

This holder 3 has the first plate-like member 31 and the second plate-like member 32. The first plate-like member 31 has the first guide hole 31h. The first guide hole 31h guides only the outer upper tube part 211 of the outer tube 21 towards the electrode part 41. The second plate-like member 32 has the second guide hole 32h. The second guide hole 32h guides only the inner lower tube part 223 of the inner tube 22 towards the inspection point. In the jig of the second embodiment, the first notch part 212 and the outer lower tube part 213 of the outer tube 21 and the second notch part 222 and the inner upper tube part 221 of the inner tube 22 are disposed in a space between the first plate-like member 31 and the second plate-like member 32.

The thicknesses of the first and second plate-like members 31 and 32 are adjusted so as to be able to hold the second contact element 20. In the following description, the thickness of each plate-like member for holding the second contact element 20 is given as an example.

The thickness z1 of the first plate-like member 31 is not particularly limited, but it is formed to be shorter than, for instance, the length x1 of the outer upper tube part 211 of the outer tube 21 (see FIG. 7).

This is because, in the state in which the second contact element 20 is held to the holder 3 and is attached to the electrode part 41, when the outer tube 21 of the second contact element 20 passes through and is supported in the first guide hole 31h and the first notch part 212 of the outer tube 21 undergoes a contracting operation, it is preferable that the first notch part 212 does not come into contact with the first plate-like member 31 of an edge of the first guide hole 31h.

The thickness z2 of the second plate-like member 32 is not particularly limited. However, the thickness z2 is formed to be shorter than, for instance, the length y3 of the inner lower tube part 223 of the inner tube 22, and the inner lower tube part 223 is disposed so as to pass through the entire length of the second guide hole 32h.

This is intended to, in the state in which the second contact element 20 is held to the holder 3 and is attached to the electrode part 41 as described above, when the inner tube of the second contact element 20 passes through and is supported in the second guide hole 32h and the second notch part 222 of the inner tube 22 is contracted, prevent the second notch part 222 from coming into contact with the second plate-like member 32 of an edge of the second guide hole 32h.

A method of manufacturing the cylindrical member forming the second contact element 20 may use a method similar to the method of manufacturing the cylindrical member forming the first contact element 2 of the first embodiment.

The foregoing description has been made of the configuration of the inspection jig 10 of the second embodiment of the present invention.

Next, a case of using the inspection jig 10 for inspection will be described.

A method of inserting the second contact element 20 into the holder 3 and attaching the holder 3 to the inspection jig is similar to that of the inspection jig 1 of the first embodiment, and the description thereof will be omitted.

Subsequently, an operation of the inspection jig 10 when carrying out an inspection will be described.

To carry out inspection, when a desired inspection end 20b comes into contact with a predetermined inspection point 81, the other-end opening 22b of the inner tube 22 which becomes the inspection end 20b comes into contact under pressure, and thus the second notch part 222 of the inner tube 22 is contracted. Here, since the outer tube 21 is fixed by the inner tube 22 and the fixed part 23, the second notch part 222 is contracted, and the first notch part 212 of the outer tube 21 is also contracted at approximately the same time. These notch parts are contracted to bring the inspection point 81 into contact under pressure. Thereby, the inspection point 81 and the electrode part 41 are electrically connected via the second contact element 20 by the contact pressure of a force obtained by composing restorative forces of the first and second notch parts 212 and 222.

Since the one-end opening 21a of the outer tube 21 is always in contact with the electrode part 41 and the one-end opening 22a of the inner tube 22 does not come into contact with the electrode part 41 even when the other-end opening 22b of the inner tube 22 is in contact with the inspection point 81 under pressure, the one-end opening 21a of the outer tube 21 or the one-end opening 22a of the inner tube 22 does not repeat a contacting/separating operation with respect to the electrode part 41 whenever the inspection end 20b comes into contact with the inspection point 81. For this reason, this helps to improve the durability of the inspection jig 10.

The foregoing description has been made of the inspection jig 10 of the second embodiment.

Next, an inspection jig 100 of a third embodiment of the present invention will be described. A main difference between the inspection jig 100 and the inspection jig 1 of the first embodiment lies in the configuration of the inspection contact element held to the holder of the inspection jig. In the following description, different configuration portions of the inspection contact element will be mainly described, and similar portions will be described as little as possible.

An inspection contact element 200 (hereinafter referred to as "a third contact element 200") used for the inspection jig 100 of the third embodiment will be described.

Further, since the third contact element 200 has a configuration similar to that of the first contact element 2, the same configuration will be described using the same symbol.

Figure 8:
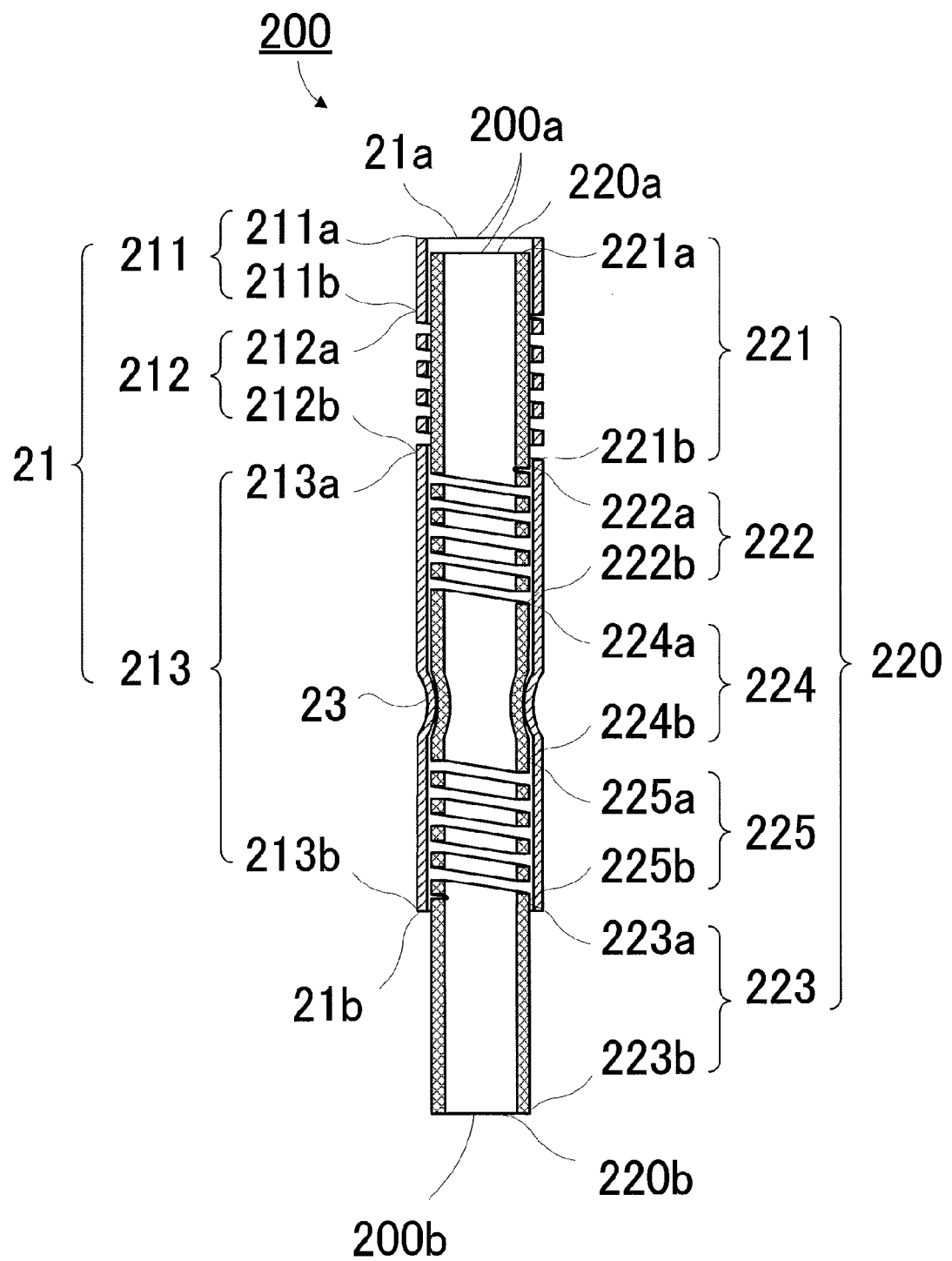
FIG. 8 is a schematic cross-sectional view of a contact element (third contact element) of a third embodiment of the present invention.
Figure 9:
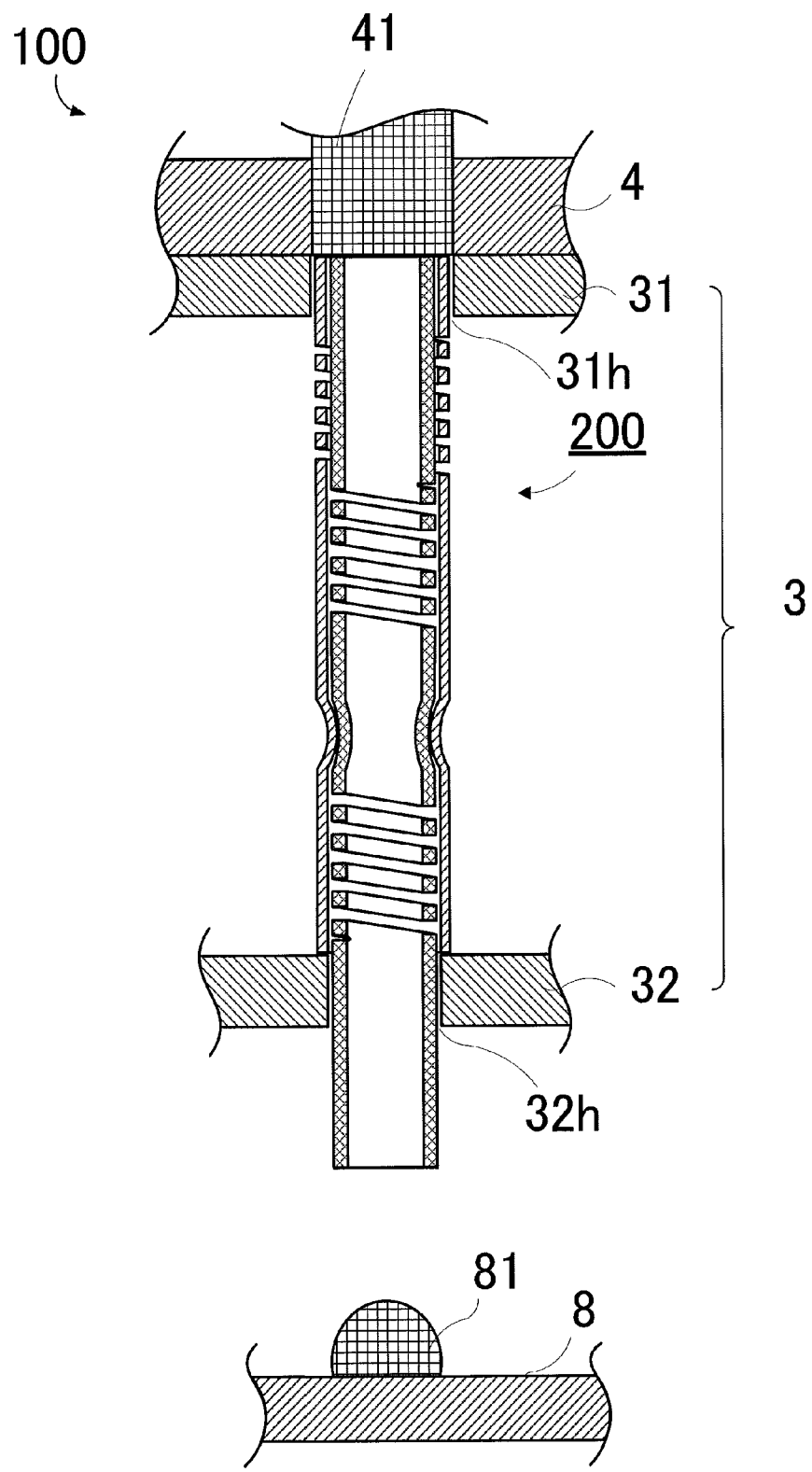
FIG. 9 is a schematic cross-sectional view of the inspection jig using the third contact element.

FIG. 8 is a schematic cross-sectional view of the third contact element 200. FIG. 9 shows a state in which the third contact element 200 is held to a holder 3 and the holder 3 is attached to the inspection jig 100. Lengths of first and second notch parts 212 and 222 shown in FIG. 9 are lengths in a state in which they are more contracted than their natural lengths. On the other hand, a third notch part 225 to be described below is not contracted, and thus a length of the third notch part 225 is the length in a no-load state.

A main difference between the third contact element 200 and the first contact element 2 is that the third notch part 225 is formed in an inner tube 220 of the third contact element 200. The notch part formed in the inner tube 22 is only the second notch part 222 in the first contact element 2, whereas the notch part formed in the inner tube 220 of the third contact element 200 is made up of a second notch part 222 and the third notch part 225.

Since the third contact element 200 functions to electrically connect an electrode part 41 and an inspection point 81 like the first contact element 2, the description thereof will be omitted. As shown in FIG. 8, the third contact element 200 includes an outer tube 21, an inner tube 220, and a fixed part 23.

The outer tube 21 of the third contact element 200 has approximately the same configuration as the configuration of the outer tube 21 of the first contact element 2, but the length of each part thereof may be adjusted based on the condition that it is different from the length of each part of the outer tube 21 of the first contact element 2. This results from the configuration of the third contact element 200 using the inner tube 220, as will be described in detail below.

A length of an outer lower tube part 213 of the outer tube 21 may be adjusted in such a way that the third notch part 225 to be described below is disposed inside the outer lower tube part 213. This is intended to prevent the third notch part 225 from coming into contact with an edge of a second guide hole 32h on the surface of a second plate-like member 32 of a holder 3 when the inner tube 220 to be described below contracts.

The inner tube 220 is formed of one conductive cylindrical member, and includes an inner upper tube part 221, a second notch part 222, an inner lower tube part 223, a middle tube part 224, and the third notch part 225 (see FIG. 8). These parts are disposed from the one-end opening 220a of the inner tube 220 toward the other-end opening 220b of the inner tube 220 in the order of the inner upper tube part 221, the second notch part 222, the middle tube part 224, the third notch part 225, and the inner lower tube part 223.

Since the inner upper tube part 221 and the second notch part 222 of the inner tube 220 are similar to the inner upper tube part 221 and the second notch part 222 of the inner tube 22 of the first contact element 2, the description thereof will be omitted.

The middle tube part 224 is a cylindrical member having one-end opening 224a and the other-end opening 224b (see FIG. 8). The one-end opening 224a of the middle tube part 224 is spatially connected with the other-end opening 222b of the second notch part 222 which was described above. The other-end opening 224b of the middle tube part 224 is spatially connected with the one-end opening 225a of the third notch part 225 to be described below. For this reason, the middle tube part 224 is formed between the second notch part 222 and the third notch part 225.

Further, the middle tube part 224 is formed with a fixed part 23 to be described below. Due to the fixed part 23, the outer tube 21 and the inner tube 220 are electrically connected and fixed (which will be described in detail below).

A longitudinal length of the middle tube part 224 may be set in such a way that the second notch part 222 does not come into contact with the first notch part 212, similarly to the inner upper tube part 221. Further, the third notch part 225 to be described below may be set so as not to come into contact with the edge of the second guide hole 32h in the surface of the second plate-like member 32.

The third notch part 225 is a cylindrical member having the one-end opening 225a and the other-end opening 225b. The one-end opening 225a of the third notch part 225 is spatially connected with the other-end opening 224b of the middle tube part 224 described above, and the other-end opening 225b of the third notch part 225 is spatially connected with one-end opening 223a of the inner lower tube part 223 to be described below. For this reason, the third notch part 225 is formed between the middle tube part 224 and the inner lower tube part 223. The third notch part 225 is formed by making a spiral notch along a wall of the cylindrical member forming the inner tube 220 in a longitudinal direction of the cylindrical member. By forming the spiral notch in the inner tube 220 in this way, the third notch part 225 functions as an elastic part that expands/contracts in the longitudinal direction of the inner tube 220.

The elastic expansion/contraction characteristic of the third notch part 225 allows it to be properly adjusted by adjusting the width, pitch or length of the notch part, adjusting the thickness of the cylindrical member, the kind of material used to make the cylindrical member, or by applying a variety of treatments (thermal treatment and chemical treatment) to the cylindrical member, and may be appropriately adjusted by a user. The notch shape of the third notch part 225 is shown as being just one in the figure, but a plurality of notches may also be formed.

The length of the third notch part 225 may be adjusted so as to create the desired contraction length or contact pressure, and simultaneously be set in such a way that, when the third contact element 200 is mounted on the holder 3, the third notch part 225 does not come into contact with the second plate-like member 32 as described above. In FIG. 9, the third notch part 225 is formed and disposed to be shorter than the length ranging from the other-end opening 213b of the outer lower tube part 213 to a position at which the fixed part 23 of the outer lower tube part 213 is formed.

The function, configuration, and shape of the inner lower tube part 223 are similar to those of the inner lower tube part 223 of the first embodiment, and so the descriptions thereof will be omitted.

A length of the inner lower tube part 223 may be set in such a way that the third notch part 225 as described above does not come into contact with the edge of the second guide hole 32h (will be described below) formed in the second plate-like member 32. Further, even when the other-end opening 223b of the inner lower tube part 223 comes into contact with the inspection point 81 and thus the second notch part 222 and the third notch part 225 of the inner tube 220 and the first notch part 212 of the outer tube contract, the length of the inner lower tube part 223 is formed so that it has a length at which the other-end opening 223b of the inner lower tube part 223 can protrude from an inspection point-side surface of the second plate-like member 32 (see FIG. 9).

The fixed part 23 is formed on the outer lower tube part 213 of the outer tube 21 and the middle tube part 224 of the inner tube 220, thereby fixing the outer tube 21 and the inner tube 220. The shape and fixing method of the fixed part are similar to those of the fixed part 23 of the first embodiment, and so the descriptions thereof will be omitted.

The third contact element 200 can be appropriately carried out using the conditions described above. However, conditions described below may also be set.

The first notch part 212 of the outer tube 21 is not disposed inside the first guide hole 31h, but it is disposed on an outer circumference of the inner upper tube part 221 of the inner tube 220, rather than on an outer circumference of the second notch part 222 of the inner tube 220. Further, the second notch part 222 of the inner tube 220 is not disposed inside the first notch part 212 of the outer tube 21, but it is disposed inside the outer lower tube part 213 of the outer tube 21. Further, the third notch part 225 of the inner tube 220 is not disposed in the second guide hole 32h, but is disposed inside the outer lower tube part 213 of the outer tube 21.

These conditions are set to form each member, and thereby each notch part is prevented from coming into contact with the other notch parts and each plate-like member. Thus, the third contact element 200 can be suitably implemented.

Further, the inner tube 220 of the third contact element 200 is configured so that the two notch parts are formed with the fixed part 23 disposed therebetween, and so that the fixed part 23 is disposed in the middle thereof.

A method of manufacturing the cylindrical member forming the third contact element 200 may be a method similar to the method used to manufacture the cylindrical member forming the first contact element 2 of the first embodiment.

The foregoing description has been made of the inspection contact element 200 (third contact element 200) of the third embodiment.

Next, when using the third contact element 200, the inspection jig 100 will be described.

The function and configuration of the holder 3 of the inspection jig 100 of the third embodiment are similar to those of the holder 3 of the first embodiment, and so descriptions thereof will be omitted.

However, thicknesses of the first and second plate-like members 31 and 32 constituting the holder 3 and a distance between both of the plate-like members may be adjusted so as to be able to prevent contact between the first notch part 212 of the third contact element 200 and the first plate-like member 31, contact between the first notch part 212 and the second notch part 222, and contact between the third notch part 225 and the second plate-like member 32.

In FIG. 9, the electrode part 41 is formed so as to come into pressure-contact with the one-end opening 21a of the outer tube 21 and the one-end opening 220a of the inner tube 220, similarly to FIG. 4 of the first embodiment. However, this is one example of the third embodiment, and the electrode part 41 is not limited to this shape.

For example, when the inspection point 81 is disposed at a pitch that is much narrower than that shown in FIG. 9, the electrode part 41 may be formed to be smaller than the outer diameter of the outer tube 21, and only the one-end opening 220a of the inner tube 220 may be disposed so as to come into contact with the electrode part 41. In this case, the one-end opening 21a of the outer tube 21 comes into contact with a surface of the electrode body 4 around the electrode part 41.

A description of when the holder 3 is attached to the inspection jig 100 is similar to that of the first embodiment, and thus will be omitted.

Next, a case in which the inspection jig 100 is used to carry out an inspection will be described.

When an inspection is carried out, the desired inspection end 200b is put into contact with a predetermined inspection point 81. Then, the other-end opening 220b of the inner tube 220 which comes into contact with the inspection point 81 comes into contact under pressure first. As such, the third notch part 225 of the inner tube 220 is contracted.

Here, since the outer tube 21 and the inner tube 220 are fixed by the fixed part 23, the third notch part 225 contracts, and the first notch part 212 of the outer tube 21 and the second notch part 222 of the inner tube 220 also contract at approximately the same time. These notch parts are contracted to bring the inspection point 81 into contact under pressure. Thereby, the inspection point 81 and the electrode part 41 are electrically connected via the third contact element 200.

Further, since the one-end opening 21a of the outer tube and the one-end opening 220a of the inner tube 220 are always in contact with the electrode part 41, the one-end opening 21a of the outer tube 21 and the one-end opening 220a of the inner tube 220 do not repeat the operation of being put in contact with and then separated from the electrode part 41 whenever the inspection end 200b comes into contact with the inspection point 81. For this reason, the deterioration of the electrode part 41 is prevented, which helps improve the durability of the inspection jig 100.

The foregoing description has been made of the inspection jig 100 of the third embodiment.

Figure 10A:
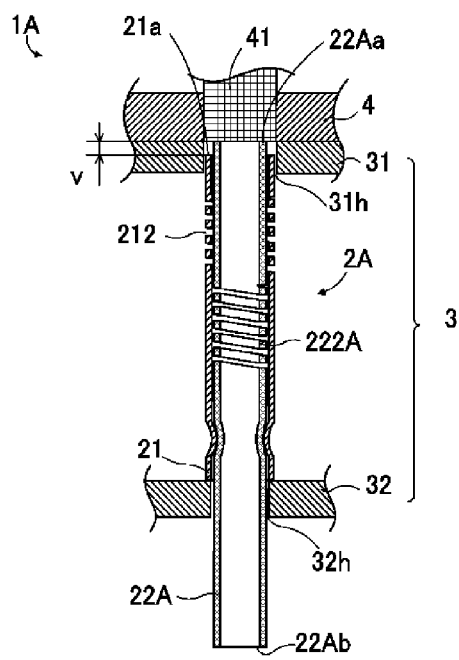
FIG. 10(a) shows a state in which the fourth contact elements is mounted on the holder.
Figure 10B:
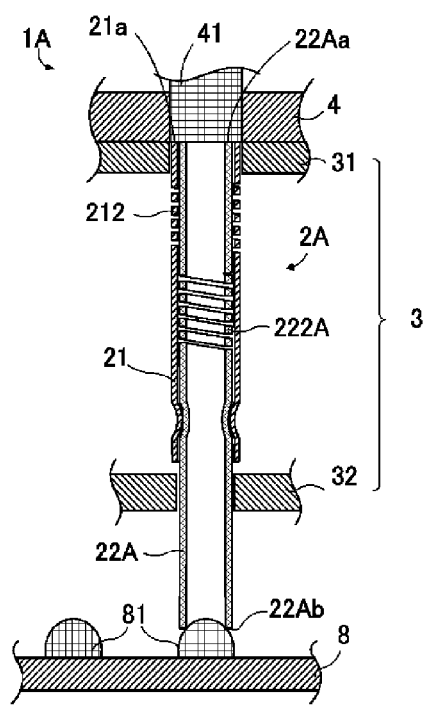
FIG. 10(b) shows a state in which the inspection is actually carried out.

Next, an inspection jig 1A of a fourth embodiment will be described. FIG. 10 is a view showing an operation of the inspection jig 1A of the fourth embodiment, wherein FIG. 10(a) is a schematic cross-sectional view showing a state in which a fourth contact element 2A is mounted on a holder 3 (in a mounting process), and FIG. 10(b) is a schematic cross-sectional view showing a state in which inspection is carried out (in an inspecting process). Further, a contact element used in the inspection jig 1A of the fourth embodiment is called a fourth contact element 2A. The fourth contact element 2A is basically similar to the first contact element 2. However, an inner tube 22A of the fourth contact element 2A is disposed so that opposite-end openings thereof extend from the outer tube 21. Further, when the fourth contact element 2A is mounted on the holder 3, one-end opening 21a of the outer tube is disposed so as not to come into contact with the electrode body 4. In the inspecting process (see FIG. 10(b)), the one-end opening 21a of the outer tube 21 is formed so as to come into contact with the electrode body 4. The timing at which the one-end opening 21a of the outer tube 21 comes into contact with the electrode body 4 ranges between when the one-end opening 22Aa of the inner tube 22A comes into contact with an inspection point 81 and thus a first notch part 222A of the inner tube 22A begins to contract and when an electrical signal is actually supplied via the fourth contact element 2A and the inspection is carried out.

The outer tube 21 of the fourth contact elements 2A does not come into contact with the electrode body 4 as long as at least the inner tube 22A has not come into contact with the inspection point 81. For this reason, in the state in which the fourth contact element 2A is mounted on the holder 3 excluding the inspecting process, the fourth contact element 2A is held to the holder 3 by the pressing force generated by the contraction of the first notch part 222A of the inner tube 22A.

Further, in the inspecting process, the fourth contact element 2A is sandwiched by the inspection point 81 and the electrode body 4, and the outer tube 21 of the fourth contact element 2A comes into contact with the electrode body 4. As such, a pressing force caused by the contraction of the first notch part 212 of the outer tube 21 and the first notch part 222A of the inner tube 22A takes place at the inspection point 81. For this reason, in the inspecting process and in the case of excluding the inspecting process (in the mounting process), the fourth contact element 2A may set a change in the weighting of the contact element itself (pressing force caused by the contraction of the notch part). For example, when the pressing force may be adjusted by reducing a pressing force applied to the holder 3 of the fourth contact element 2A or by increasing a pressing force applied to the inspection point, this makes it possible to increase the force applied to the inspection point 81 while reducing the force applied to the second plate-like member 32 of the holder 3.

To render the operation of the outer tube 21 as described above possible, for example, the fourth contact elements 2A is configured so that that the one-end opening 22Aa of the inner tube 22A is formed to protrude from the one-end opening 21a of the outer tube 21 by a predetermined length. The protruding length of the inner tube 22A is adjusted to a length by which the electrode body 4 and the outer tube 21 are disposed to have a spatial length v in the mounting process shown in FIG. 10(a), and by which the electrode body 4 and the outer tube 21 comes into pressure-contact with each other in the inspecting process shown in FIG. 10(b). In this case, the length of the outer tube 21 is formed to be shorter than a distance from a surface of the second plate-like member 32 to a surface of the electrode body 4, and is set to a length at which the one-end opening 21a of the outer tube 21 is disposed in a guide hole of the first plate-like member 31, and at which the first notch part 212 of the outer tube 21 can be sufficiently contracted in the inspecting process.

Further, the spatial length v is not particularly limited as long as it is a length by which a space can be formed when the fourth contact elements 2A are mounted on the holder 3.

As shown in FIG. 10, the electrode part 41 of the electrode body 4 may be formed so as to have a diameter that is approximately equal to or greater than that of the outer tube 21, and to have a size such that it comes into contact with only the inner tube 22A in a state of conduction (slightly greater diameter than the inner tube 22A).

Figure 11A:
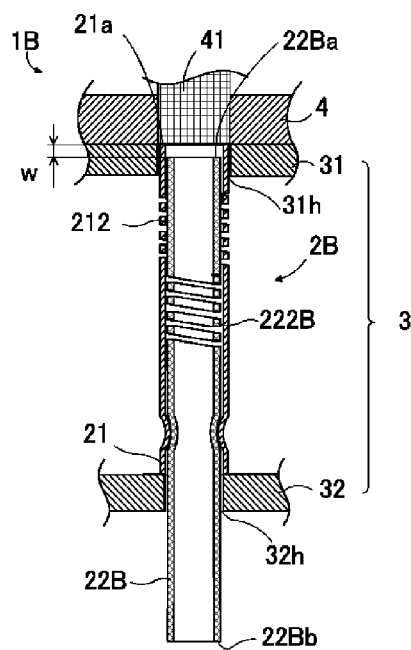
FIG. 11(a) shows a state in which the fifth contact elements is mounted on the holder.
Figure 11B:
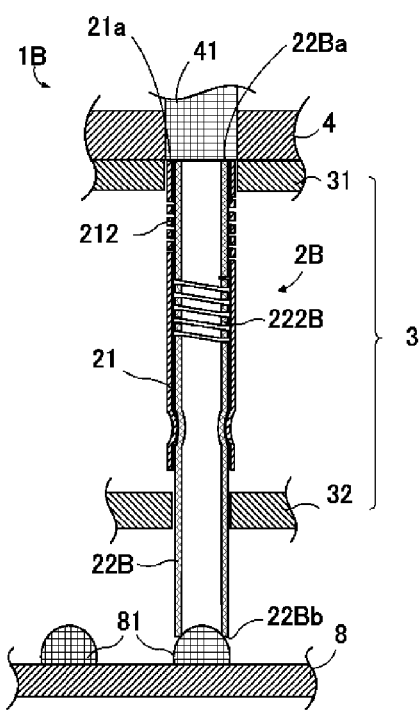
FIG. 11(b) shows a state in which the inspection is actually carried out.

Next, an inspection jig 1B of a fifth embodiment will be described. FIG. 11 is a view showing an operation of the inspection jig 1B of the fifth embodiment, wherein FIG. 11(a) is a schematic cross-sectional view showing a state in which a fifth contact element 2B is mounted on a holder 3 (in the mounting process), and FIG. 11(b) is a schematic cross-sectional view showing a state in which the inspection is carried out (in an inspecting process). Further, a contact element used in the inspection jig 1B of the fifth embodiment is called a fifth contact element 2B. The fifth contact element 2B is basically similar to the first contact element 2. One-end opening 22Ba of an inner tube 22B of the fifth contact element 2B is disposed farther inside than the outer tube 21 (so that the one-end opening 21a of the outer tube 21 is disposed to protrude from the inner tube 22B). When the fifth contact element 2B is mounted onto the holder 3 (see FIG. 11(a)), the one-end opening 22Ba of the inner tube 22B is disposed so as not to come into contact with an electrode body 4. Further, in the inspecting process (see FIG. 11(b)), the one-end opening 22Ba of the inner tube 22B is formed so as to come into contact with an electrode body 4.

The timing at which the one-end opening 22Ba of the inner tube 22B is put into contact with the electrode body 4 ranges between when the one-end opening 22Ba of the inner tube 22B has come into contact with an inspection point 81 and thus a first notch part 212 of the outer tube 21 begins to contract and when an electrical signal is actually supplied via the fifth contact element 2B and the inspection is carried out.

The inner tube 22B of the fifth contact element 2B does not come into contact with the electrode body 4 as long as at least the inner tube 22B has not come into contact with the inspection point 81. For this reason, in the mounting process (a state in which the fifth contact element 2B is mounted on the holder 3 excluding the inspecting process), the fifth contact element 2B is held to the holder 3 by a pressing force generated by the contraction of the first notch part 212 of the outer tube 21. Further, in the inspecting process, the fifth contact element 2B is sandwiched between the inspection point 81 and the electrode body 4, and the inner tube 22B of the fifth contact element 2B comes into contact with the electrode body 4. As such, a pressing force caused by the contraction of the first notch part 212 of the outer tube 21 and the first notch part 222B of the inner tube 22B takes place at the inspection point 81. For this reason, in the inspecting process and in the case of excluding the inspecting process (in the mounting process), the fifth contact element 2B may set a change in the weighing of the contact element itself (the pressing force caused by the contraction of the notch part). For example, when the pressing force can be adjusted by reducing a pressing force applied to the holder 3 of the fifth contact element 2B or by increasing the pressing force applied to the inspection point, this makes it possible to increase the force applied to the inspection point 81 while reducing the force applied to the second plate-like member 32 of the holder 3.

To render the operation of the inner tube 22B as described above possible, for example, the fifth contact element 2B is configured so that the one-end opening 21a of the outer tube 21 is formed to protrude from the one-end opening 22Ba of the inner tube 22B by a predetermined length. The protruding length of the outer tube 21 is adjusted to a length by which the electrode body 4 and the inner tube 22B are disposed to have a spatial length w in the mounting process shown in FIG. 11(a), and by which the electrode body 4 and the inner tube 22B come into pressure-contact with each other in the inspecting process shown in FIG. 11(b). In this case, the length of the outer tube 21 is formed to be longer than a distance from a surface of the second plate-like member 32 to a surface of the electrode body 4 by a predetermined length. The first notch part 212 of the outer tube 21 contracts by this predetermined length. This length is set to be the length at which the one-end opening 21a of the outer tube 21 is disposed in a guide hole of the first plate-like member 31, and at which the first notch part 212 of the outer tube 21 can be sufficiently contracted in the inspecting process.

As shown in FIG. 11, the electrode part 41 of the electrode body 4 may be formed so as to have a diameter that is approximately equal to or greater than that of the outer tube 21, and to have a size within which it comes into contact with only the inner tube 22B in a state of conduction (a slightly greater diameter than the inner tube 22B).

By providing the contact element according to the present invention, even when a diameter of the contact element is less than 100 μm, a contact element having a load of at least 20 mN, preferably 50 mN or so can be provided. For this reason, the contact element can provide sufficient contact pressure by which an oxide layer on a surface of the inspection target section formed of solder or aluminum can be reliably destroyed and by which it can make reliable contact with a portion where the inspection target section has not been oxidized.

Further, the tips of the upper and lower ends of each of the first to fifth contact elements are formed so as to be the end faces, but they are not limited to this shape. For example, the tip may be formed into a tapered part that seems to be a pointed shape or be formed in a crown shape having a plurality of convex parts.

The first to fifth contact elements are each formed by combining two cylindrical members. However, the inspection contact element may also be formed by combining, for example, a plurality of cylindrical members whose diameters are gradually increased in such a way that one contact element is formed by, when three cylindrical members having different diameters (diameter and inner diameter) are used, disposing the cylindrical member with the smallest diameter at the innermost side, disposing the cylindrical member with the next smallest diameter at the outer side thereof, and disposing the cylindrical member with the largest diameter at the outer side thereof.

The length of each part in the first to fifth contact elements has been described to use a relation of each length in the preferable state thereof. However, the length of each part is not limited to this relation, and thus may be properly adjusted if, in a case in which a gap between the neighboring members (e.g. between the first notch part and the first plate-like member, between the first notch part and the second notch part, between the second notch part and the second plate-like member, or between the third notch part and the second plate-like member) is sufficiently secured and the notch part conducts the motion of contraction, the motion of contraction is not impeded even when the notch part comes into contact with the member acting as the counterpart.

The first to fifth contact elements are each configured so that the other-end opening of the inner tube is formed as an inspection end so as to come into contact with the inspection point 81. However, for example, the contact element may be formed so as to have a conductive rod-like member (not shown) in the inner tube. This rod-like member is electrically connected and fixed in such a way that a front end thereof is disposed in the inner tube and that a rear end thereof protrudes from the other-end opening of the inner tube. The position in the inner tube at which the front end is disposed is not particularly limited. For example, the front end may be disposed in the inner upper tube part. The rod-like member is provided in this way, and thereby the rear end comes into contact with the inspection point 81. As such, the electrical connection of the inspection contact element and the inspection point 81 can be reliably secured. Further, the rod-like member can function as a guide when the notch part formed in the inner tube contracts.

Further, an insulating film may also be formed on the outer circumferential surface of the outer tube of each of the first to fifth contact elements. By forming the insulating film in this way, when a plurality of first to fifth contact elements are attached to the holder 3, the neighboring contact elements can be prevented from coming into contact with each other in a state of conduction.

In the embodiments of the fourth and fifth contact elements, it does not matter that the notch part is formed in the inner lower tube part. Even when the notch part is formed in the inner lower tube part, this does not serve as a barrier to the mechanism of the fourth and fifth contact elements, so that it can be suitably implemented.

DESCRIPTION OF REFERENCE NUMERALS

1 inspection jig in the first embodiment
10 inspection jig in the second embodiment
100 inspection jig in the third embodiment
1A inspection jig in the fourth embodiment
1B inspection jig in the fifth embodiment
2 inspection contact element (first contact element) in the first embodiment
20 inspection contact element (second contact element) in the second embodiment
200 inspection contact element (third contact element) in the third embodiment
2A inspection contact element (fourth contact element) in the fourth embodiment
2B inspection contact element (fifth contact element) in the fifth embodiment
21 outer tube
22 inner tube (first and second embodiments)
220 inner tube (third embodiment)
22A inner tube (fourth embodiment)
22B inner tube (fifth embodiment)
23 fixed part
3 holder
31 first plate-like member
31*h* first guide hole
32 second plate-like member
32*h* second guide hole
4 electrode body
41 electrode parts
5 conducting wire
8 inspection target
81 inspection point

What is claimed is:

1. An inspection jig that electrically connects an inspection target having a plurality of inspection points used as targets to be inspected and an inspection device inspecting electrical characteristics between the inspection points, the inspection jig comprising:
    an electrode body having a plurality of electrode parts electrically connected with the inspection device;
    inspection contact elements electrically connecting the electrode parts with the inspection points; and
    a holder having a first plate-like member guiding one ends of the inspection contact elements toward the electrode parts and a second plate-like member guiding the other ends of the inspection contact elements toward the inspection points, and holding the inspection contact elements,
    wherein
    each inspection contact element includes
        an outer tube whose one-end opening comes into contact with the second plate-like member, and
        an inner tube coaxially disposed inside the outer tube, and disposed to extend from the one-end opening of the outer tube,
    the outer tube includes
        an outer lower tube part having a one-side opening coming into contact with the second plate-like member,
        a first notch part spatially connected with the other-side opening of the outer lower tube part, formed in a tubular shape of the same diameter as the outer lower tube part, and having a spiral notch in a wall of the tubular shape in a longitudinal direction, and
        an outer upper tube part formed in a tubular shape of the same diameter as the first notch part and spatially connected with the first notch part,
    the inner tube includes
        an inner lower tube part having a one-side opening electrically connected with the inspection point, a second notch part spatially connected with an other-side opening of the inner lower tube part, formed in a tubular shape of the same diameter as the inner lower tube part, and having a spiral notch in a tubular wall in a longitudinal direction, and an inner upper tube part formed in a tubular shape with the same diameter as the second notch part and spatially connected with the second notch part, the outer tube and the inner tube have a fixed part fixing the outer lower tube part and the inner lower tube part, and when the inner lower tube part of the inner tube comes into pressure-contact with the inspection point and inspection is carried out, the inner tube and the outer tube are sandwiched by the inspection point and the electrode body, and the first notch part and the second notch part are contracted.

2. The inspection jig according to claim 1, wherein, when the inner lower tube part of the inner tube does not come into contact with the inspection point, the inner tube and the outer tube are sandwiched by the inspection point and the electrode body, and the first notch part and the second notch part are contracted.

3. The inspection jig according to claim 1, wherein, when the inner lower tube part of the inner tube does not come into contact with the inspection point, the first notch part is kept at a natural length, and
the second notch part is contracted as the inner tube is sandwiched by the second plate-like member and the electrode body.

4. The inspection jig according to claim 1, wherein, when the inner lower tube part of the inner tube does not come into contact with the inspection point, the first notch part is contracted as the outer tube is sandwiched by the second plate-like member and the electrode body, and the second notch part is kept at a natural length.

5. The inspection jig according to claim 1, wherein the inner tube includes a spiral notch formed in a periphery of the inner tube between the fixed part of the inner tube and the inspection point in a longitudinal direction.

6. The inspection jig according to claim 1, wherein a length by which the first notch part is contracted is adjusted by a distance from a surface of the electrode body to a surface of the second plate-like member and by a length of the outer tube.

7. An inspection jig that electrically connects an inspection target having a plurality of inspection points used as targets to be inspected and an inspection device inspecting electrical characteristics between the inspection points, the inspection jig comprising:

an electrode body having a plurality of electrode parts electrically connected with the inspection device;
inspection contact elements electrically connecting the electrode parts with the inspection points; and
a holder holding the inspection contact elements,
wherein
each inspection contact element includes
an outer tube whose front-end opening becomes an electrode end coming into contact with the electrode part, and
a conductive inner tube which protrudes from a rear-end opening of the outer tube, which is electrically connected in the outer tube to be disposed coaxially with the outer tube, and whose front-end opening becomes an inspection end coming into contact with the inspection point under pressure, wherein
the outer tube includes
an outer upper tube part having a front-side opening used as the electrode end,
a first notch part which has the same diameter as the outer upper tube part, whose front-end opening is spatially connected with a rear-end opening of the outer upper tube part, and which has a spiral notch formed in a periphery in a longitudinal direction, and
an outer lower tube part having the same diameter of the first notch part and spatially connected with a rear-end opening of the first notch part,
the inner tube includes
an inner lower tube part having a front-side opening becoming the inspection end,
a second notch part which has the same diameter as the inner lower tube part, whose front-end opening is spatially connected with a rear-end opening of the inner lower tube part, and which has a spiral notch formed in a periphery in a longitudinal direction, and
an inner upper tube part having the same diameter of the second notch part, spatially connected with a rear-end opening of the second notch part, and disposed in the outer tube,
the outer tube and the inner tube have a fixed part that electrically connects and fixes the outer lower tube part and the inner upper tube part, and
the holder includes
a first plate-like member having a first guide hole guiding the electrode end of the outer tube toward the electrode part, and
a second plate-like member disposed apart from the first plate-like member at a predetermined interval and having a second guide hole guiding the inspection end of the inner tube toward the inspection point.

8. The inspection jig according to claim 7, wherein, when the inspection end and the inspection point are in non-contact state, the outer tube is configured so that the front-end opening thereof comes into contact with the electrode part under pressure, and so that the rear-end opening thereof comes into contact with the second plate-like member under pressure.

9. The inspection jig according to claim 7, wherein the rear-end opening of the inner tube is always housed in the outer upper tube part.

10. The inspection jig according to claim 7, wherein the front-end opening of the outer tube has an end face perpendicular to a longitudinal direction of the outer tube.

11. An inspection contact element that is electrically connected with one of a plurality of electrode parts installed on an electrode body of an inspection jig electrically connecting a plurality of inspection points of an inspection target which are used as targets to be inspected and an inspection device inspecting electrical characteristics between the inspection points, the inspection contact element comprising:

an outer tube whose front-end opening becomes an electrode end that comes into contact with a surface of the electrode body; and
a conductive inner tube which protrudes from a rear-end opening of the outer tube, which is electrically connected in the outer tube to be disposed coaxially with the outer tube, and whose front-end opening becomes an inspection end coming into contact with the inspection point under pressure, wherein
the outer tube includes
an outer upper tube part having a front-side opening becoming the electrode end, a first notch part of a tubular shape which has the same diameter as the outer upper tube part, whose front-end opening is spatially connected with a rear-end opening of the outer upper tube part, and which has a spiral notch formed in a periphery in a longitudinal direction, and an outer lower tube part having the same diameter of the first notch part and spatially connected with a rear-end opening of the first notch part, the inner tube includes an inner lower tube part having a front-side opening becoming the inspection end, a second notch part of a tubular shape which has the same diameter as the inner lower tube part, whose front-end opening is spatially connected with a rear-end opening of the inner lower tube part, and which has a spiral notch formed in a periphery in a longitudinal direction, and an inner upper tube part having the same diameter as the second notch part, spatially connected with a rear-end opening of the second notch part, and coming into contact with the electrode part under pressure when the inner lower tube part comes into contact with the inspection point, and the outer tube and the inner tube have a fixed part that electrically connects and fixes the outer lower tube part and the inner upper tube part.

12. The inspection contact element according to claim 11, wherein, when one or both of the first notch part of the outer tube and the second notch part of the inner tube contract, the front-end opening of the outer tube and the rear-end opening of the inner tube are located on the same plane.

13. The inspection contact element according to claim 11, wherein the inner tube includes a spiral notch formed in a periphery of the inner tube between the fixed part of the inner tube and the inspection end in a longitudinal direction.

14. The inspection contact element according to claim 11, wherein:
the front-end opening of the outer tube has an end face perpendicular to a longitudinal direction of the outer tube; and
the rear-end opening of the inner tube has an end face perpendicular to a longitudinal direction of the inner tube.

15. An inspection contact element that is electrically connected with one of a plurality of electrode parts installed on an electrode body of an inspection jig electrically connecting a plurality of inspection points of an inspection target which are targets to be inspected and an inspection device inspecting electrical characteristics between the inspection points, the inspection contact element comprising:

an outer tube whose front-end opening becomes an electrode end coming into contact with the electrode part; and a conductive inner tube which protrudes from a rear-end opening of the outer tube, which is electrically connected in the outer tube to be disposed coaxially with the outer tube, and whose front-end opening becomes an inspection end coming into contact with the inspection point under pressure, wherein the outer tube includes an outer upper tube part having a front-side opening used as the electrode end, a first notch part of a tubular shape which has the same diameter as the outer upper tube part, whose front-end opening is spatially connected with a rear-end opening of the outer upper tube part, and which has a spiral notch formed in a periphery in a longitudinal direction, and an outer lower tube part having the same diameter of the first notch part and spatially connected with a rear-end opening of the first notch part, the inner tube includes an inner lower tube part having a front-side opening used as the inspection end, a second notch part of a tubular shape which has the same diameter as the inner lower tube part, whose front-end opening is spatially connected with a rear-end opening of the inner lower tube part, and which has a spiral notch formed in a periphery in a longitudinal direction, and an inner upper tube part having the same diameter as the second notch part, spatially connected with a rear-end opening of the second notch part, and disposed in the outer tube, and the outer tube and the inner tube have a fixed part that electrically connects and fixes the outer lower tube part and the inner upper tube part.

16. The inspection contact element according to claim 15, wherein the rear-end opening of the inner tube is always housed in the outer upper tube part.

17. The inspection contact element according to claim 15, wherein the front-end opening of the outer tube has an end face perpendicular to a longitudinal direction of the outer tube.

18. The inspection contact element according to claim 15, wherein:
the inspection contact element includes a conductive rod-like member disposed in the inner tube; and
the rod-like member is fixed to the inner upper tube part or the inner lower tube part, and extends from the front-end opening of the inner tube.

* * * * *